US008977520B2

(12) United States Patent
Stephens et al.

(10) Patent No.: US 8,977,520 B2
(45) Date of Patent: Mar. 10, 2015

(54) COMPUTER SYSTEM FOR AUTOMATICALLY CLASSIFYING ROOF ELEMENTS

(75) Inventors: John William Stephens, Rochester, NY (US); Frank D. Giufrrida, Honeoye Falls, NY (US); Stephen L. Schultz, West Henietta, NY (US); Steve Adams, Rush, NY (US); Yandong Wang, Webster, NY (US)

(73) Assignee: Pictometry International Corp., Rochester, NY (US)

( * ) Notice: Subject to any disclaimer, the term of this patent is extended or adjusted under 35 U.S.C. 154(b) by 1018 days.

(21) Appl. No.: 12/909,692

(22) Filed: Oct. 21, 2010

(65) Prior Publication Data

US 2012/0101783 A1 Apr. 26, 2012

(51) Int. Cl.
*G06F 17/50* (2006.01)
(52) U.S. Cl.
CPC .................................. *G06F 17/5004* (2013.01)
USPC ........................................................... 703/1
(58) Field of Classification Search
CPC . G06F 17/50; G06F 17/5004; G06F 17/5018; G06F 17/5095; G06T 19/00
See application file for complete search history.

(56) References Cited

U.S. PATENT DOCUMENTS

| 2008/0262789 A1 | 10/2008 | Pershing et al. | |
| 2009/0132436 A1* | 5/2009 | Pershing et al. | .............. 705/400 |
| 2010/0110074 A1 | 5/2010 | Pershing | |
| 2010/0114537 A1 | 5/2010 | Pershing | |
| 2010/0179787 A2 | 7/2010 | Pershing et al. | |

FOREIGN PATENT DOCUMENTS

WO PCT/US2011/055107 5/2013

OTHER PUBLICATIONS

Jaynes et al. "Three-Dimensional Grouping and Information Fusion for Site Modeling from Aerial Images", 1996.*
Christopher Albert Ciarcia et al., U.S. Appl. No. 12/590,131, Not yet published, filed Nov. 2, 2009.

* cited by examiner

*Primary Examiner* — Saif Alhija
(74) *Attorney, Agent, or Firm* — Dunlap Codding, P.C.

(57) ABSTRACT

A set of instructions stored on at least one computer readable medium for running on a computer system. The set of instructions includes instructions for identifying line segments of a roof that is preferably displayed within a geo-referenced image, instructions for determining three-dimensional information of the line segments including position, orientation and length of the line segments preferably utilizing the geo-referenced image, and instructions for classifying, automatically, at least one of the line segments as one of a plurality of predefined roof elements utilizing at least one of the relative position and orientation of the line segments.

19 Claims, 20 Drawing Sheets

Roof Estimate /160
2010-10-20 13:40:08.0

| | | |
|---|---|---|
| Customer Name | George Eastman | |
| Latitude / Longitude | 43.152044 / -77.580309 | |
| Address | 900 EAST AVE ROCHESTER NY 14607 | /162 |
| Claim Number | 123-ABC | |
| Job Number | 9876 | |

■ Rake
■ Sidewall Flashing
■ Hip
■ Valley
■ Eave
▦ Ridge
■ Unknown

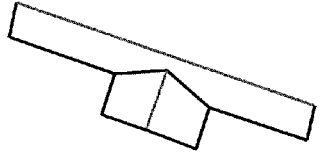

*Measurement Summary*

| | |
|---|---|
| Roof Type | Gable |
| Main Roof Pitch | 15.1/12 |
| Total Roof Area | 2628 Square Feet |
| Total Roof Area (Squares) | 26 Squares |
| Total Eave Length | 100.5 Feet |
| Total Hip Ridge Length | 0 Feet |
| Total Valley Length | 40.1 Feet |
| Total Horizontal Ridge Length | 126.6 Feet |
| Total Open Rake Length | 75.9 Feet |
| Total Sidewall Flashing Length | 0 Feet |
| Total Number Box Vent | 2 |
| Total Hip Length | 0 Feet |
| Unknown Line Length | 0 Feet |

/164    /166

*||| POWERED BY*
Pictometry

Fig. 3

COMPUTER SYSTEM FOR AUTOMATICALLY CLASSIFYING ROOF ELEMENTS

CROSS REFERENCE TO RELATED APPLICATIONS

Not Applicable.

FIELD OF INVENTION

The presently claimed and disclosed invention(s) relate to methods and computer systems for generating information indicative of roofs of buildings using geo-referenced images. More particularly, the presently claimed and disclosed invention(s) use a methodology for automatically classifying line segments as one of a plurality of predefined roof elements utilizing at least one of a relative position and orientation of the line segments.

BACKGROUND OF THE ART

In the remote sensing/aerial imaging industry, imagery is used to capture views of a geographic area and to be able to measure objects and structures within the images as well as to be able to determine geographic locations of points within the image. These are generally referred to as "geo-referenced images" and come in two basic categories:

Vertical Imagery—these images are captured with the camera pointed vertically downward and thus generally only capture the tops of structures.

Oblique Imagery—these images are captured with the camera aimed at an angle so as to capture the sides of structures as well as the tops.

Most vertical imagery is processed in order to fit a mathematically rectangular projection or map. This process is known as ortho-rectification and attempts to create an appearance as if the sensor were directly above each pixel in the image. The resulting image is known as an ortho-photo. Since the images are mathematically projected, they can be combined into a seamless mosaic. The resulting composite image is called an ortho-mosaic. The term "ortho image" is used to denote an image that is either an ortho-photo image or an ortho-mosaic image.

Because they are captured looking straight down, an ortho-photo or ortho-mosaic contains a view of the world to which we are not accustomed. As a result, many people have difficulty determining what it is they are looking at in the image. For instance, they might have difficulty distinguishing between two commercial properties since the only thing they can see of the properties in the ortho-mosaic is their roof tops, where as most of the distinguishing properties are on the sides of the buildings. An entire profession, the photo interpreter, has arisen to address these difficulties as these individuals have years of training and experience specifically in interpreting what they are seeing in ortho imagery.

Since an oblique image, by definition, is captured at an angle, it presents a more natural appearance because it shows the sides of objects and structures—what we are most accustomed to seeing. In addition, because oblique images are not generally ortho-rectified, they are still in the natural appearance that the camera captures as opposed to the mathematical construction of the ortho image. This combination makes it very easy for people to look at something in an oblique image and realize what that object is. Photo interpretation skills are not required when working with oblique images.

In the past, people have used geo-referenced oblique images to measure objects and structures within the images as well as to be able to determine geographic locations of points within the image when preparing estimates for a variety of construction projects, such as roadwork, concrete work, and roofing. Estimating construction projects using software is desirable in that it increases the speed at which an estimate can be prepared, and reduces labor and fuel costs associated with on-site visits. For roofing, this is even more important since measuring an actual roof can be a costly and potentially hazardous job—especially with steeply pitched roofs.

With respect to estimating roofing projects, software for measuring the pitch of a roof of a building using a geo-referenced oblique image has been developed. This software causes a computer system to display an oblique image, and provides a "pitch tool" to measure the area and pitch of a roof in an oblique image. To measure pitch, the software permits the user to (1) click a pitch tool, (2) measure a height from the ground to the roofs eave by clicking at the ground, dragging to the eave, and then releasing the mouse button, (3) measure the height from the ground to the roof's peak, by clicking at the ground, dragging to the peak, and then releasing the mouse button, and (4) measure a distance of a ridge-line by clicking where the user last released the mouse, dragging along the ridge-line to the opposite end of the roof, and then releasing the mouse button.

The prior software displayed an area outline and a measurement on the image, and the following measurements appeared on a status bar: area, eave height, peak height, roof angle, roof, and roof pitch (rise over run).

Software for measuring the slope of a roof without using elevation data has also been developed. The software allows a user to measure slope (change in elevation between two points) without using elevation data by clicking a point in a first image at which to start the slope measurement. A small red crosshair marked the starting point. A corresponding point was clicked in a second image, and then a point in the first image at which to end the slope measurement was clicked. A line connected the starting and ending points and a dialog box showed a slope, a distance, a height difference and a pitch.

However, the prior software did not include any manner of automatically classifying roof elements, such as ridge lines, drip edges or eaves and the like so that reports including cumulative lengths of such roof elements could be automatically or semi-automatically prepared. It is to such an improvement that the present disclosure is directed.

SUMMARY OF DISCLOSURE

In one version, the present disclosure describes a set of instructions stored on at least one computer readable medium for running on a computer system. The set of instructions may be a sequence of instructions that are ordered or linked to work together. The set of instructions includes instructions for identifying line segments of a roof, instructions for determining three-dimensional information of the line segments including position, orientation and length of the line segments, and instructions for classifying, automatically, at least one of the line segments as one of a plurality of predefined roof elements utilizing at least one of the relative position and orientation of the line segments. Exemplary roof elements include an eave (which may be referred to as a drip edge line), a hip, a sidewall flashing, a valley, a rake, and a ridge.

In another version, the present disclosure describes a method for configuring a computer system for displaying one or more geo-referenced image on a display. In this method, a set of instructions on a computer readable medium is made accessible to a processor of a computer system, the set of instructions including instructions for: identifying line segments of a roof, determining three-dimensional information of the line segments including position, orientation and length of the line segments, and classifying, automatically, at least one of the line segments as one of a plurality of predefined roof elements utilizing at least one of the relative position and orientation of the line segments.

In another version, the present disclosure describes a method in which a set of instructions stored on at least one computer readable medium is sold and distributed. The set of instructions includes instructions for identifying line segments of a roof; determining three-dimensional information of the line segments including position, orientation and length of the line segments; and classifying, automatically, at least one of the line segments as one of a plurality of predefined roof elements utilizing at least one of the relative position and orientation of the line segments.

In yet another version, the present disclosure describes a method in which access to a set of instructions stored on a first computer readable medium is provided for installation on a second computer readable medium associated with a user device. For example, the first computer readable medium can be portable, such as a CD-ROM, and the second computer readable medium can be one or more physical hard drives or memories which may be partitioned into one or more logical drives. The set of instructions includes instructions for: identifying line segments of a roof; determining three-dimensional information of the line segments including position, orientation and length of the line segments; and classifying, automatically, at least one of the line segments as one of a plurality of predefined roof elements utilizing at least one of the relative position and orientation of the line segments.

In yet another version, the present disclosure describes a computer system including at least one processor; and one or more computer readable medium. The one or more computer readable medium stores a set of instructions that when executed by the at least one processor cause the at least one processor to: identify line segments of a roof displayed within one or more geo-referenced images; determine three-dimensional information of the line segments including position, orientation and length of the line segments utilizing the one or more geo-referenced images; and classify, automatically, at least one of the line segments as one of a plurality of predefined roof elements utilizing at least one of the relative position and orientation of the line segments.

In various aspects, the set of instructions may include instructions for generating a three-dimensional model of the roof utilizing the line segments, as well as at least one instruction for storing classification information indicative of a classification of the at least one line segment as the plurality of predefined roof elements. The line segments preferably have lengths, and the set of instructions may include instructions for generating a report including a cumulative length of the line segments for one or more predefined roof element. The line segments may also include end points, and wherein the set of instructions further comprising instructions for grouping the end points of the line segments by elevation. The instructions for grouping the end points of the line segments by elevation may also include instructions for receiving user input to group the end points of the line segments by elevation. In another aspect, the set of instructions may also include instructions for calculating an elevation of each end point of the line segments and then averaging the elevation within each group of end points. In yet another aspect, the set of instructions includes instructions for determining whether at least two points on the line segments (such as the end points) are at a same elevation in classifying the line segments as predefined roof elements.

In further aspects, the set of instructions includes instructions for determining an angle between adjacent line segments in classifying one of the line segments as at least one of a rake and a valley; and instructions for determined a relative elevation between line segments within a roof section in classifying one of the line segments as at least one of a ridge and an eave.

BRIEF DESCRIPTION OF THE SEVERAL VIEWS OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

FIG. 3 is a pictorial representation of a roof report prepared in accordance with the present disclosure.

DETAILED DESCRIPTION

Figure 1:
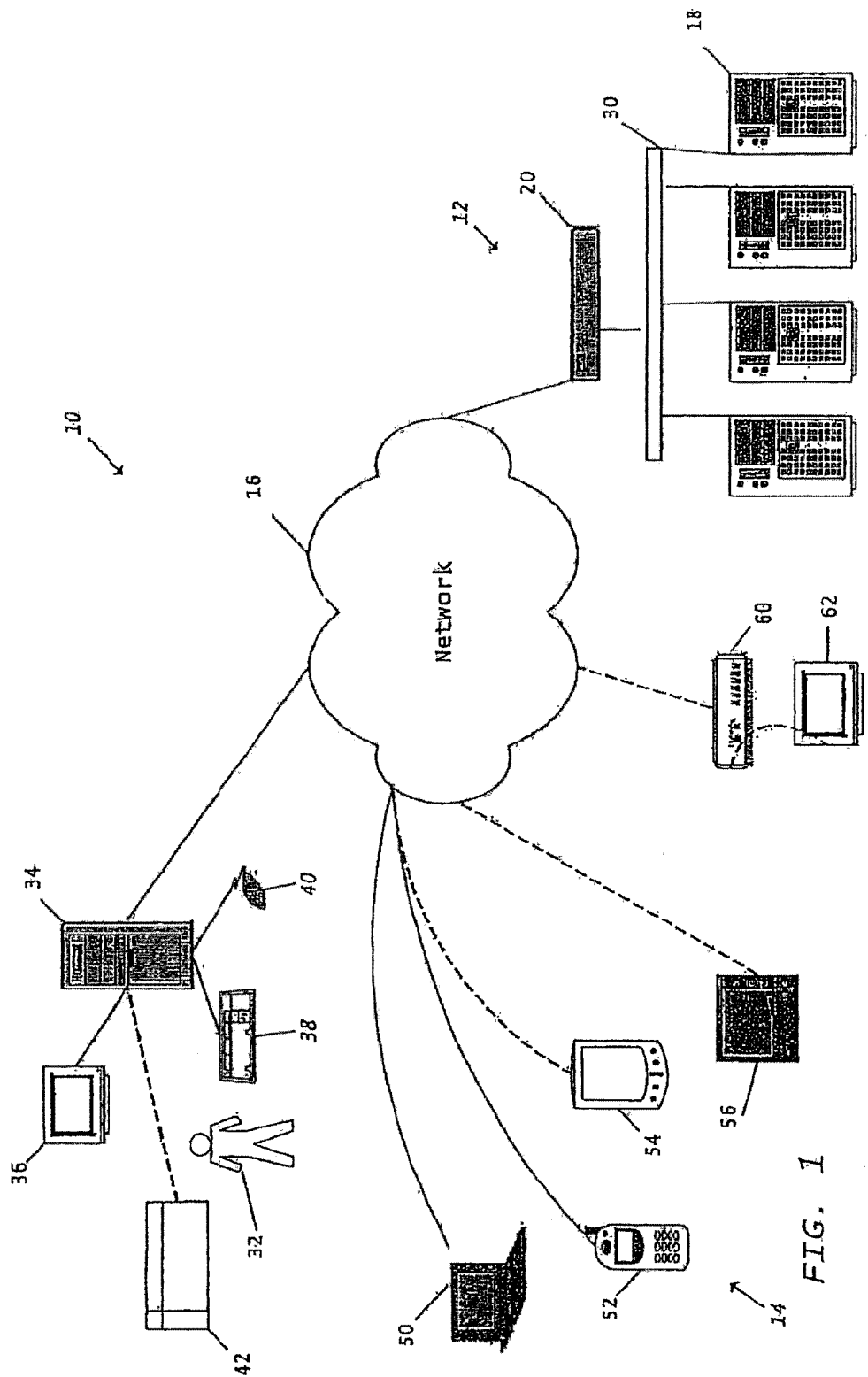
FIG. 1 is a schematic diagram of the hardware forming an exemplary embodiment of a computer system constructed in accordance with the present disclosure.

Before explaining at least one embodiment of the disclosure in detail, it is to be understood that the disclosure is not limited in its application to the details of construction, experiments, exemplary data, and/or the arrangement of the components set forth in the following description or illustrated in the drawings.

The disclosure is capable of other embodiments or of being practiced or carried out in various ways. Also, it is to be understood that the phraseology and terminology employed herein is for purpose of description and should not be regarded as limiting.

Referring now to the drawings, and in particular to FIG. 1, shown therein and designated by a reference numeral 10 is an exemplary computer system constructed in accordance with the present disclosure. The computer system 10 can be a system or systems that are able to embody and/or execute the logic of the processes described herein. The logic embodied in the form of software instructions, or firmware may be executed on any appropriate hardware which may be a dedicated system or systems, or a personal computer system, or distributed processing computer system. In particular, the logic can be implemented in a stand-alone environment operating on a single computer system, or the logic can be implemented in a networked environment such as a distributed system using multiple computers and/or processors.

Preferably, the computer system 10 is distributed, and includes a host system 12, communicating with one or more user devices 14 via a network 16. The network 16 can be the Internet or other network. In either case, the host system 12 typically includes one or more servers 18 configured to communicate with the network 16 via one or more gateways 20. When the network 16 is the Internet, the primary user interface of the computer system 10 is delivered through a series of web pages, but the primary user interface can be replaced by another type of interface, such as a Windows-based application. This method is also used when deploying the computer system 10 in a stand-alone environment such as a kiosk.

The network 16 can be almost any type of network although Internet and Internet 2 networks are preferred because of the wide support of their underlying technologies. The preferred embodiment of the network 16 exists in an Internet environment, which means a TCP/IP-based network. It is conceivable that in the near future, the preferred or other embodiments, may wish to use more advanced networking topologies.

The servers 18 can be networked with a LAN 30. The gateway 20 is an entity responsible for providing access between the LAN 30 and the network 16. The gateway 20 can also be used as a security means to protect the LAN 30 from attack from external networks such as the network 16.

The LAN 30 network can be based on a TCP/IP network such as the Internet, or it can be based on another underlying network transport technology. The preferred embodiment uses an Ethernet network with TCP/IP because of the availability and acceptance of underlying technologies, but other embodiments may use other types of networks such as Fibre Channel, SCSI, Gigabit Ethernet, etc.

As discussed above, in one preferred embodiment, the host system 12 includes the servers 18. The configuration of the server hardware will depend greatly upon the requirements and needs of the particular embodiment of the computer system 10. Typical embodiments, including the preferred embodiment, will include multiple servers 18 with load balancing to increase stability and availability. It is envisioned that the servers 18 will include database servers and application/web servers. The database servers are preferably separated from the application/web servers to improve availability and also to provide the database servers with improved hardware and storage.

The user devices 14 can be any number and type of devices. The most typical scenario of the user device 14 involves a user 32, using a computer 34 with a display 36, keyboard 38, and mouse 40. The display 36 can be a single monitor or multiple adjacent monitors. Typically, the user device 14 uses a type of software called a "browser" as indicated by a reference numeral 42 to render HTML/XHTML content that is generated when requesting resources from a source, such as the host system 12. In the preferred embodiment, the computer system 10 is designed to be compatible with major Web Browser vendors (e.g., Microsoft Internet Explorer, Google Chrome, Mozilla Firefox, and Opera). Other embodiments may wish to focus on one particular browser depending upon the common user base using the computer system 10.

The user devices 14 can also be implemented as a portable device such as a laptop computer 50 (or handheld computer); a cellular telephone 52 with a micro or embedded Web Browser; a Portable Digital Assistant 54 (PDA) capable of wireless network access; a pen-based or tablet computer 56. In another embodiment, the user device 14 can be a cable box 60 or other similar device for viewing through a display 62 or television. Current embodiments of computer system 10 can also be modified to use any of these or future developed devices.

The computer system 10 is designed in this way as to provide flexibility in its deployment. Depending upon the requirements of the particular embodiment, the instructions could be designed to work in almost any environment such as a desktop application, a web application, or even simply as a series of web services designed to communicate with an external application.

The hardware and system software are designed with two key concerns; flexibility and scalability. Although some specifics for software and hardware components may be mentioned herein, it will be understood that a wide array of different components could be substituted, such as using different database vendors or even replacing the databases with XML-based document stores.

When the computer system 10 is used to execute the logic of the processes described herein, such computer(s) and/or execution can be conducted at a same geographic location or multiple different geographic locations. Furthermore, the execution of the logic can be conducted continuously or at multiple discrete times.

In general, the computer system 10 is capable of displaying and navigating geo-referenced imagery, such as aerial imagery. The geo-referenced imagery can be represented by a single pixel map, or by a series of tiled pixel maps that when aggregated recreate the image pixel map.

The computer system 10 will be described by way of example utilizing aerial images shown on the display 36 of the computer 34. However, it should be understood that the computer system 10 can use other types of images, such as architectural images.

Figure 2:
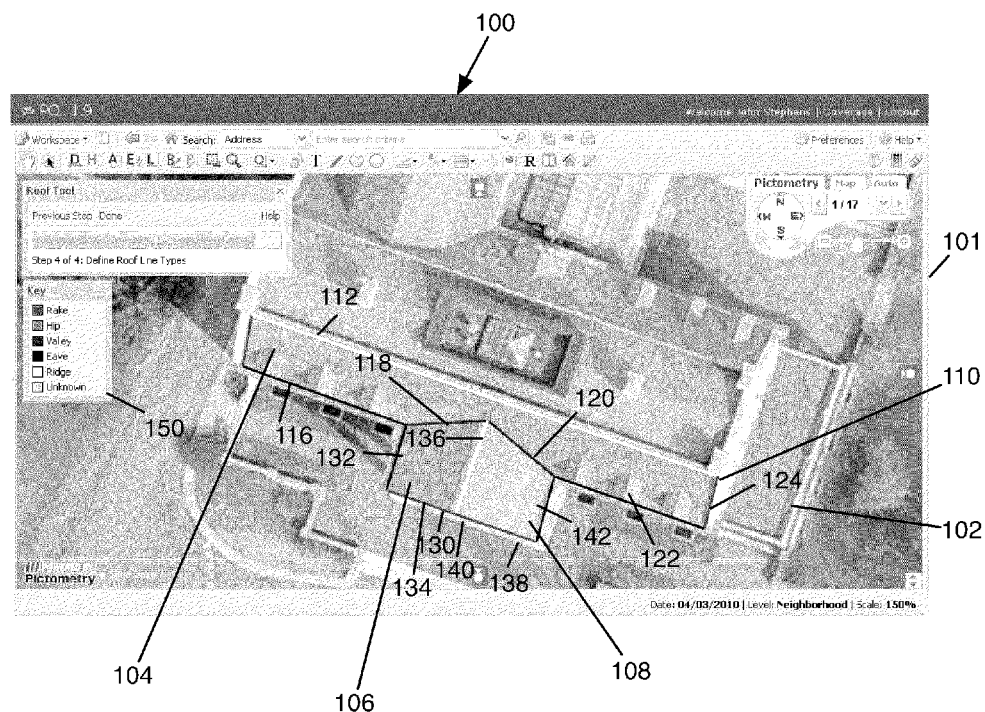
FIG. 2 is a pictorial representation of a display of the computer system having a first image showing a building having a roof in accordance with the present disclosure.

Shown in FIG. 2 is a screen 100 displayed on the display 36 of the computer 34. The screen 100 shows a first image 101 of a portion of a building 102 having a roof 103 with three separate roof sections identified by reference numerals 104, 106, and 108. The roof 103 can be of various shapes, types and/or sizes. For example, the roof 103 can be of a type identified as a gable roof, a flat roof, a hip roof, an intersecting roof, a gambrel roof, a mansard roof, a butterfly roof or a shed roof. The first image 101 is preferably an orthogonal image, but can be an oblique image. The roof section 104 includes a perimeter 110 defined by line segments 112, 114, 116, 118, 120, 122, and 124. The roof section 106 includes a perimeter 130 defined by line segments 118, 132, 134, and 136. The roof section 108 includes a perimeter 138 defined by line segments 120, 136, 140, and 142. The various line segments 112, 114, 116, 118, 120, 122, 124, 132, 134, 136, 140 and 142 may or may not be interconnected.

In accordance with the presently disclosed inventive concepts, the computer system 10 includes one or more computer readable medium storing instructions that when implemented by one or more processors of the computer system 10 causes the one or more processors to display the screen 100, as well as for identifying the line segments 112, 114, 116, 118, 120, 122, 124, 132, 134, 136, 140 and 142; determining 3-dimensional information of the line segments 112, 114, 116, 118, 120, 122, 124, 132, 134, 136, 140 and 142 including position, orientation and length of the line segments 112, 114, 116, 118, 120, 122, 124, 132, 134, 136, 140 and 142; and classifying, automatically, at least one of the line segments 112, 114, 116, 118, 120, 122, 124, 132, 134, 136, 140 and 142 as one of a plurality of predefined roof elements utilizing at least one of a relative position and orientation of the line segments 112, 114, 116, 118, 120, 122, 124, 132, 134, 136, 140 and 142. Preferably, the computer system 10 automatically classifies all of the line segments 112, 114, 116, 118, 120, 122, 124, 132, 134, 136, 140 and 142. The three-dimensional information of the line segments 112, 114, 116, 118, 120, 122, 124, 132, 134, 136, 140 and 142 can be determined in any suitable manner, such as by calculating the information utilizing a single image in a manner disclosed by U.S. Pat. No. 7,424,133; calculating the information with two images utilizing stereoscopic photogrammetry techniques, and/or loading the information from one or more table(s).

The three-dimensional information can be implemented using any suitable methodology and preferably includes a position, length and orientation of each of the line segments 112, 114, 116, 118, 120, 122, 124, 132, 134, 136, 140 and 142. For example, the three dimensional coordinates, for each of the line segments 112, 114, 116, 118, 120, 122, 124, 132, 134, 136, 140 and 142 could be identified as a point, a direction and a length, and/or could include x, y, z coordinates of two end points on the line segment such that the length can be determined.

The screen 100 is also provided with a legend 150 showing a variety of predefined roof elements that can be automatically determined by the instructions discussed herein. The predefined roof elements are shown by way of example as a rake, a hip, a valley, an eave, a ridge, and unknown. The roof element identified in FIG. 2 as a "rake" can also be referred to herein as a "gable"; the roof element identified in FIG. 2 as a "eave" can also be referred to herein as a "drip edge" or a "drip edge line". In addition, other types of roof elements may also be determined by the instructions, such as sidewall flashing (which may also be referred to herein as an "intersecting rake") as well as a headwall flashing. For example, the line segments 114, 124, 134, and 140 have been automatically classified as a rake; the line segments 118 and 120 have been automatically classified as a valley; the line segments 116, 132, 122 and 142 have been automatically classified as eaves; and the line segment 112 has been automatically classified as a ridge.

Referring now to FIG. 3, in accordance with the presently disclosed inventive concepts, a report 160 can be automatically and/or manually prepared which includes a summary of the cumulative lengths of the line segments 112, 114, 116, 118, 120, 122, 124, 132, 134, 136, 140 and 142 for each predefined roof element. In general, the report 160 is provided with multiple zones including, for example, a job information zone 162, a predefined roof element zone 164, and a measurement zone 166.

The job information zone 162 includes information identifying the building 102 for which the report 160 has been prepared. Various identifying information such as address, latitude/longitude, customer name and/or owner name can be provided within the job information zone 162. The identifying information can be provided in a plurality of fields provided within a merge document, for preparing the report 160.

The predefined roof element zone 164 includes a listing of the predefined roof elements, and the measurement zone 166 includes cumulative totals for the measurements of the various line segments 112, 114, 116, 118, 120, 122, 124, 132, 134, 136, 140 and 142 which are automatically classified according to the predefined roof elements. For example, the cumulative roof area of the roof sections 104, 106 and 108 is 2593.32 square feet; and the total eave length of the line segments 116, 122, 132 and 142 is equal to 100.21 feet. The information within the predefined roof element zone 164 and the measurement zone 166 can be provided in a plurality of fields provided within a merge document for automating and/or preparing the report 160.

The computer readable medium is a device that can be read either directly or indirectly by one or more processor of the computer system 10. The computer readable medium can be a part of the host system 12, the user devices 14 or combinations thereof. Examples of the computer readable medium include an optical storage device such as a CD-ROM, a magnetic storage device such as a disk, an electronic storage device such as a memory or the like.

Figure 4:
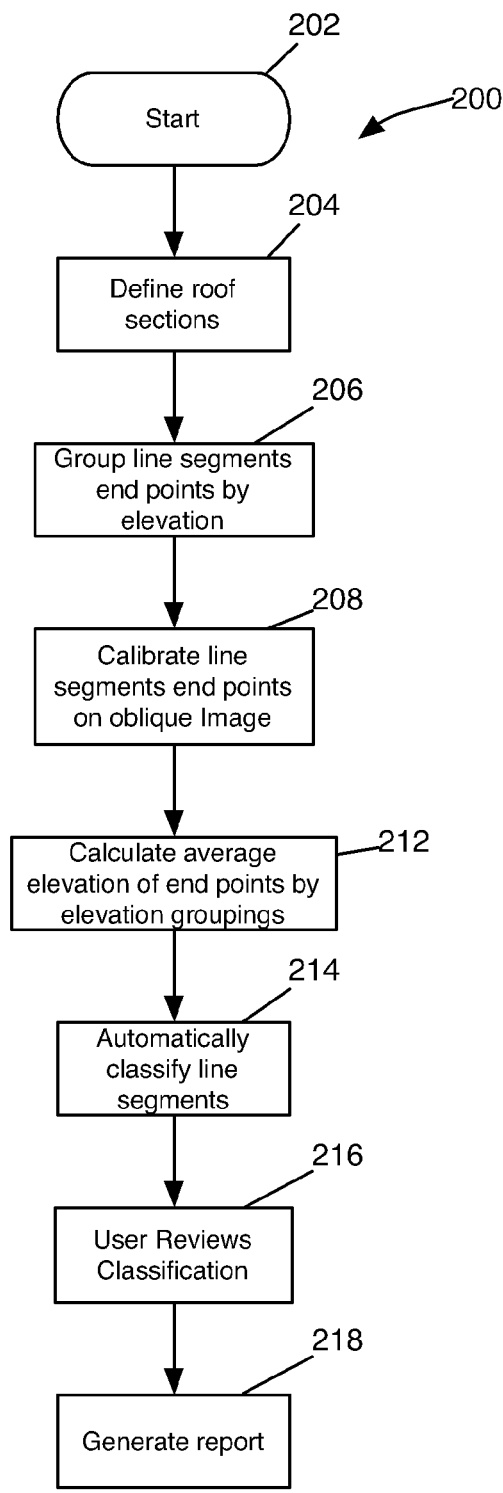
FIG. 4 is a logic flow diagram summarizing a classification process in accordance with the present disclosure for automatically classifying line segments as one of a plurality of predefined roof elements utilizing at least one of a relative position and orientation of the line segments.

Referring now to FIG. 4, shown therein is a flow chart illustrating a classification process 200 developed in accordance with the presently disclosed inventive concepts implemented in the form of instructions being run by one or more processors of the computer system 10, preferably with the aid of one or more users utilizing the user devices 14. In particular, the classification process 200 starts as indicated by a step 202, and then branches to a step 204 in which the roof sections 104, 106 and 108, for example, are defined. Typically, this occurs by providing the screen 100 on the display 36 via the computer 34, and/or the host system 12 and the user 32 selecting various end points within the first image 101 to define the line segments surrounding the roof sections 104, 106 and 108, such as the line segments 112, 114, 116, 118, 120, 122, 124, 132, 134, 136, 140, and 142 surrounding the roof sections 104, 106 and 108. This is described in more detail below with reference to FIG. 5.

Once all of the roof sections (e.g., roof sections 104, 106 and 108) have been defined within the first image 101, the classification process 200 branches to a step 206 where end points of the line segments 112, 114, 116, 118, 120, 122, 124, 132, 134, 136, 140, and 142 are grouped by elevation. This is described in more detail below with reference to FIG. 6 and increases the accuracy of the classification process 200 by permitting an average elevation value to be utilized in the classification process 200.

Thereafter, the classification process 200 branches to a step 208 where a second image 210 (shown in FIGS. 7a, 7b, 8a, 8b, 9a and 9b) of the building 102 is shown. The second image 210 can be an orthogonal image, or an oblique image. In any event, each group of the line segments 112, 114, 116, 118, 120, 122, 124, 132, 134, 136, 140, and 142 is preferably calibrated to the second image 210, and then the classification process 200 branches to a step 212 where an elevation for each of the end points of the line segments 112, 114, 116, 118, 120, 122, 124, 132, 134, 136, 140, and 142 is calculated utilizing the first image 101 and the second image 210 preferably using stereo photogrammetry techniques. An average elevation value is calculated for each group prior to or during a step 214. In the step 214, the classification process 200 automatically classifies at least one, and preferably all of the line segments 112, 114, 116, 118, 120, 122, 124, 132, 134, 136, 140, and 142 as one of the plurality of predefined roof elements utilizing at least one of a relative position and orientation of the line segments 112, 114, 116, 118, 120, 122, 124, 132, 134, 136, 140, and 142. The relative position and/or orientation of the line segments 112, 114, 116, 118, 120, 122, 124, 132, 134, 136, 140, and 142 can be calculated utilizing the average elevation value.

Figure 10:
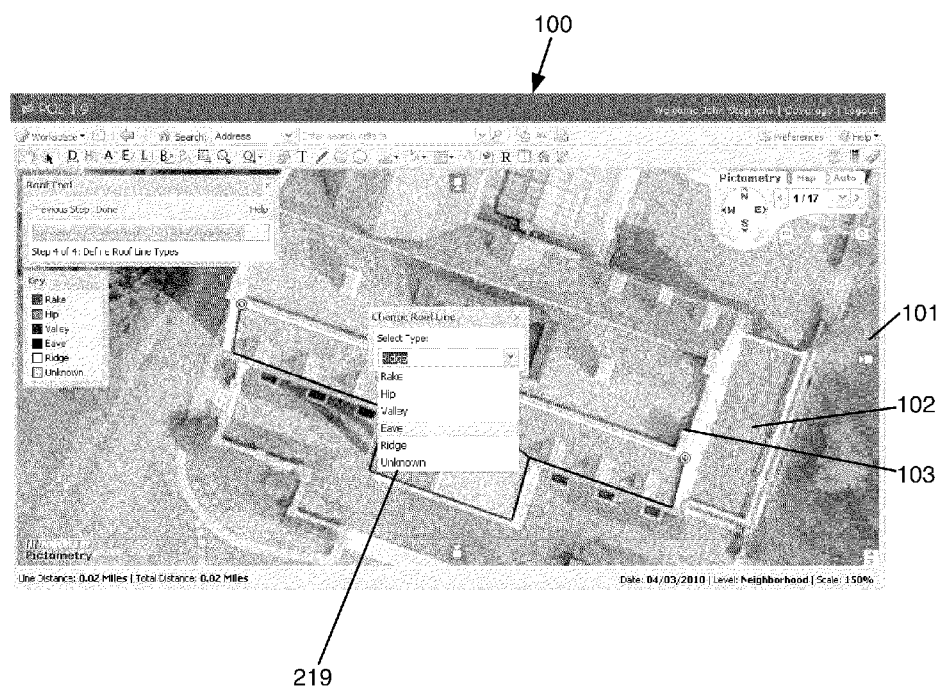
FIG. 10 is a pictorial representation of the display of the computer system having the second image utilized for reviewing and reclassifying automatically classified rooflines/line segments in accordance with the presently disclosed inventive concepts.

Once the line segments 112, 114, 116, 118, 120, 122, 124, 132, 134, 136, 140, and 142 are classified, the classification process branches to a step 216 to permit user review of the classifications and make any changes if necessary or desirable, and then the classification process 200 branches to a step 218 to generate the report 160. As shown in FIG. 10, the screen 100 may include an input block 219, such as a text box or field, for changing the classification of the line segments 112, 114, 116, 118, 120, 122, 124, 132, 134, 136, 140, and 142.

The first image 101, and the second image 210 can be any type of image that has location coordinates or a measuring system stored with or associated with the image. The computer system 10 uses one or more databases or servers 18 (see FIG. 1) to store the first image 101, and the second image 210 in an organized format. The first image 101, second image 210 can use any color space, and be stored in any industry supported file format, such as TIFF, JPEG, TARGA, GIF, BMP, ECW or the like.

In practice, the methodology disclosed and claimed herein, includes multiple steps and data transformations that can be accomplished by one of ordinary skill in the art given the present specification. Either instructions running on the host system 12 or the instructions running on the user devices 14 can be used for automatically classifying the line segments 112, 114, 116, 118, 120, 122, 124, 132, 134, 136, 140, and 142 as one of the plurality of predefined roof elements.

Figure 5:
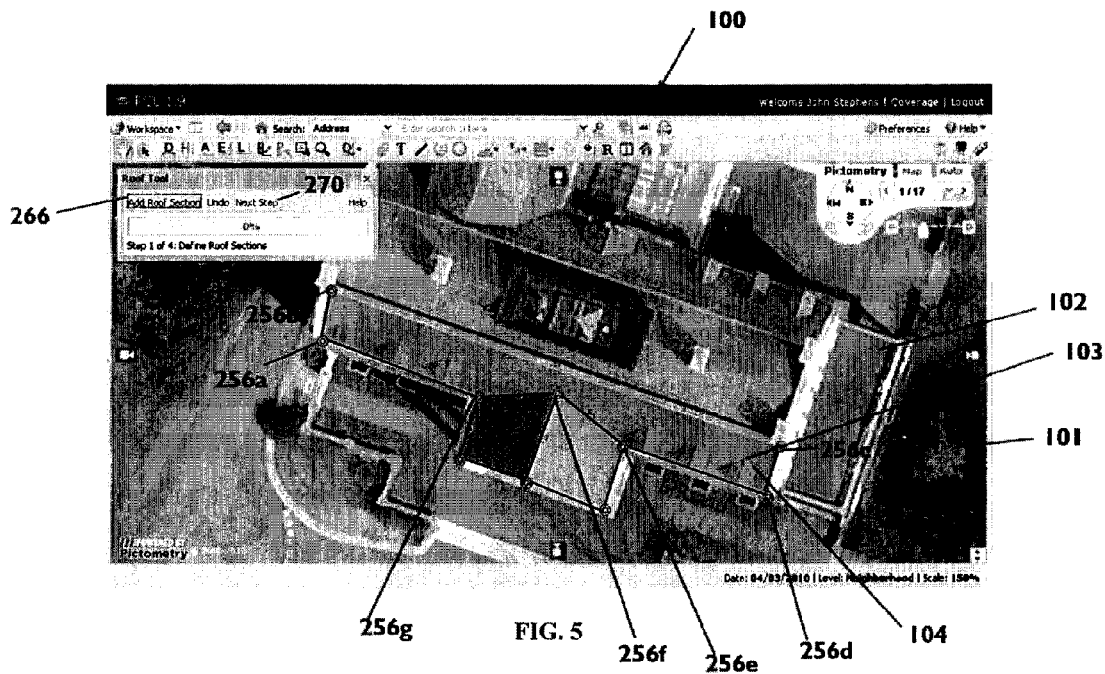
FIG. 5 is a pictorial representation of the display of the computer system showing an exemplary process for defining roof sections in accordance with the presently disclosed inventive concepts.
Figure 11:
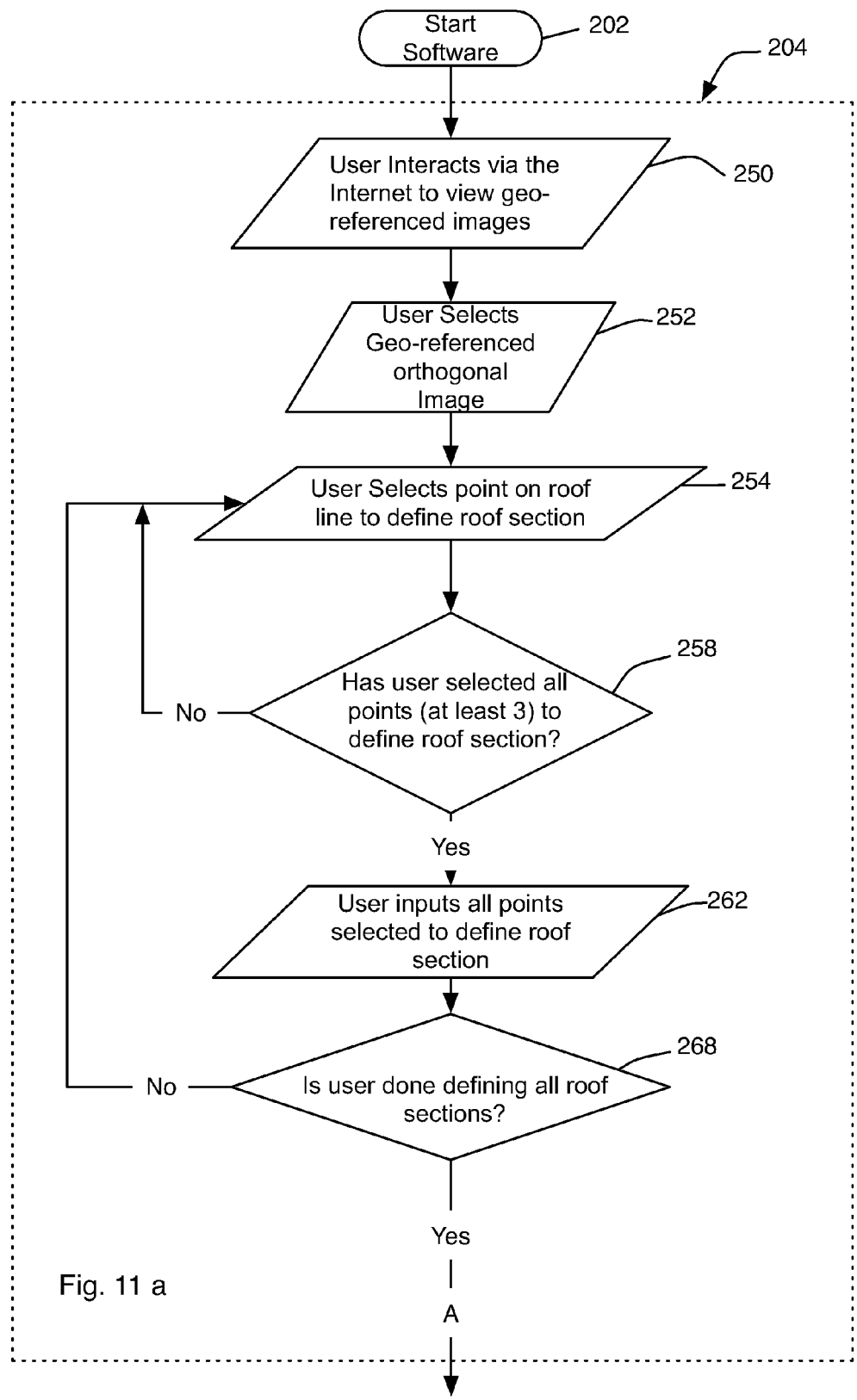
FIGS. 11a-k cooperate to form a more detailed exemplary logic flow diagram of the classification process in accordance with the present disclosure for automatically classifying line segments as one of a plurality of predefined roof elements utilizing at least one of a relative position and orientation of the line segments.
Figure 11:
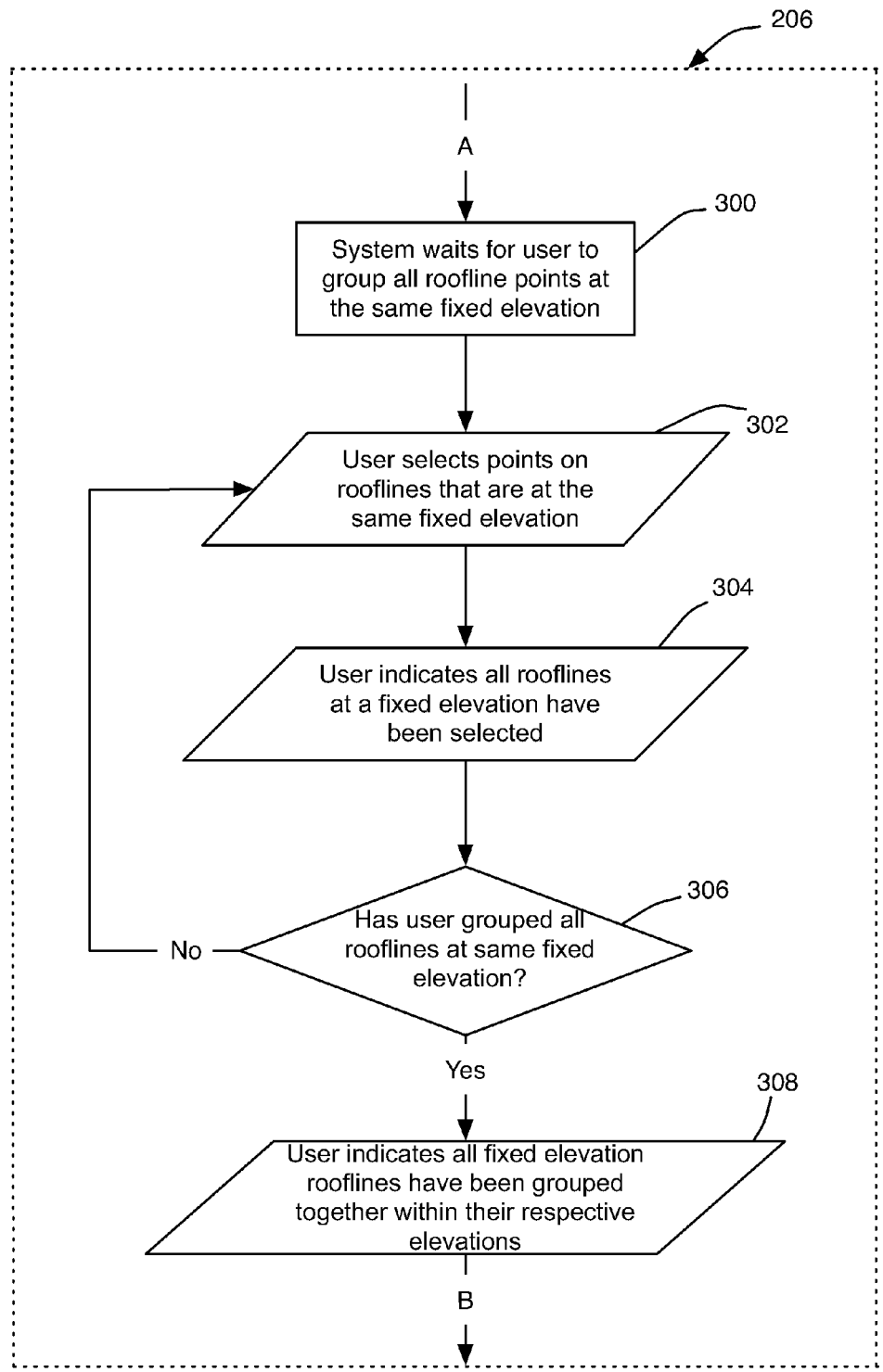
Figure 11:
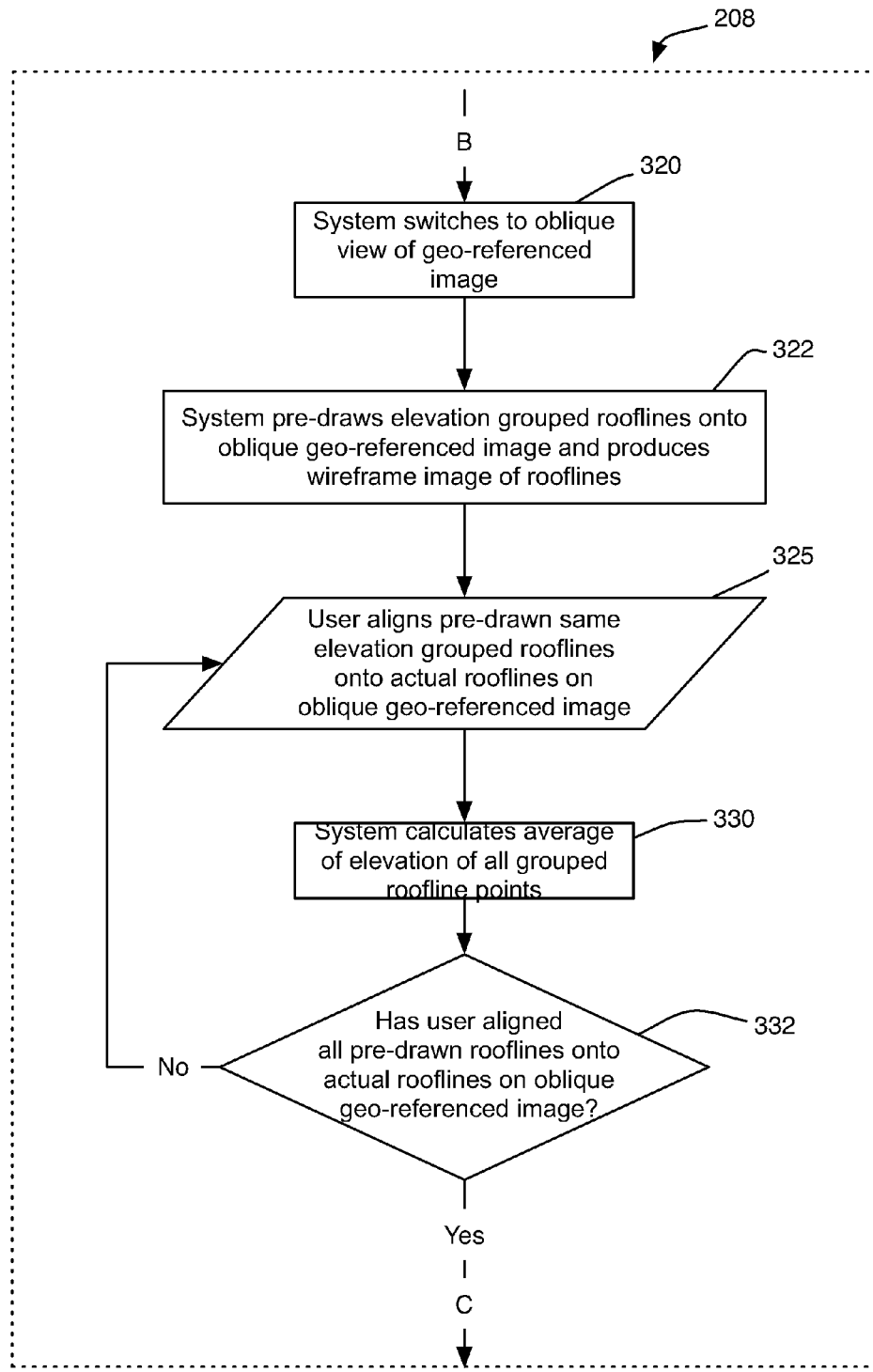
Figure 11:
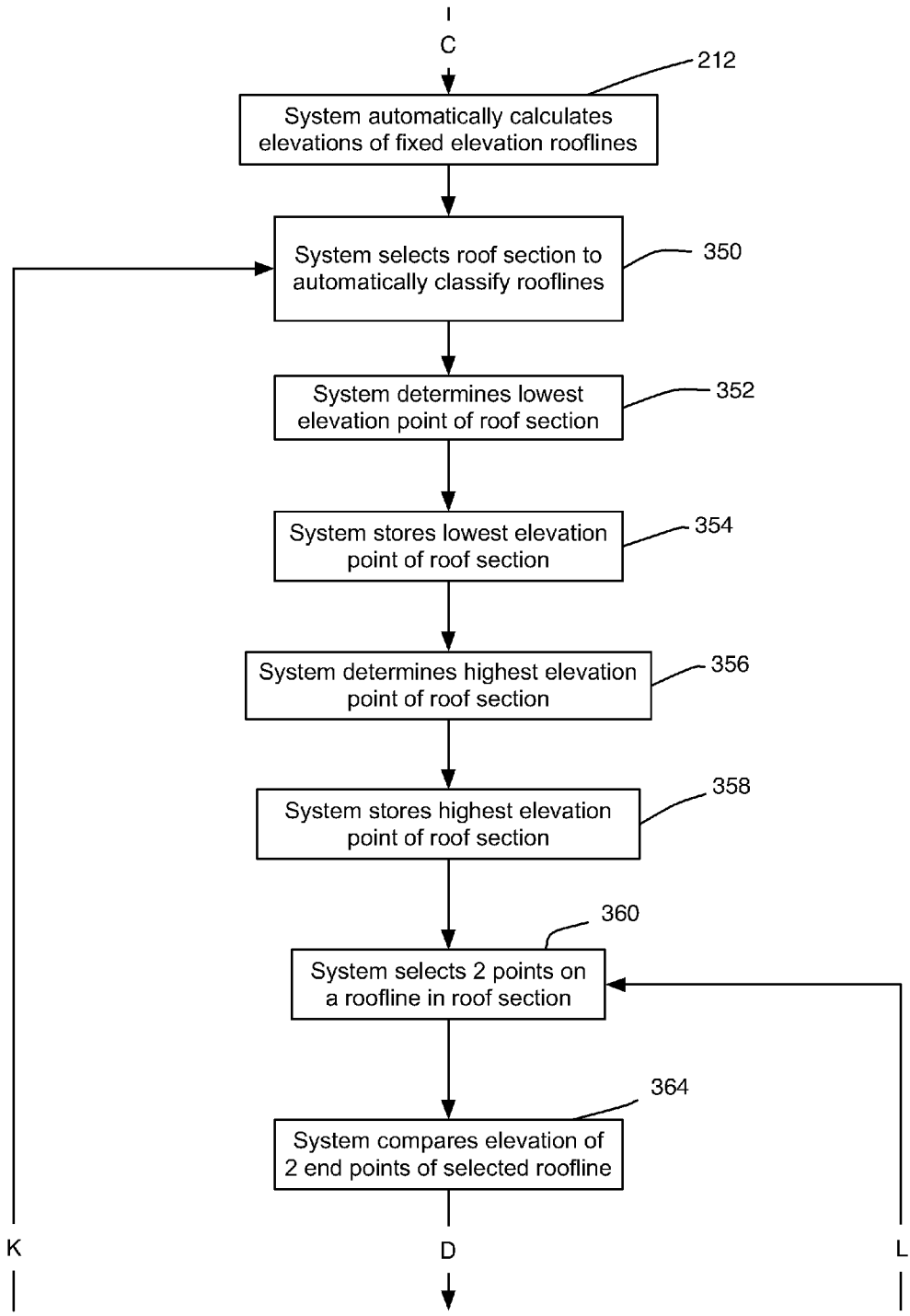
Figure 11:
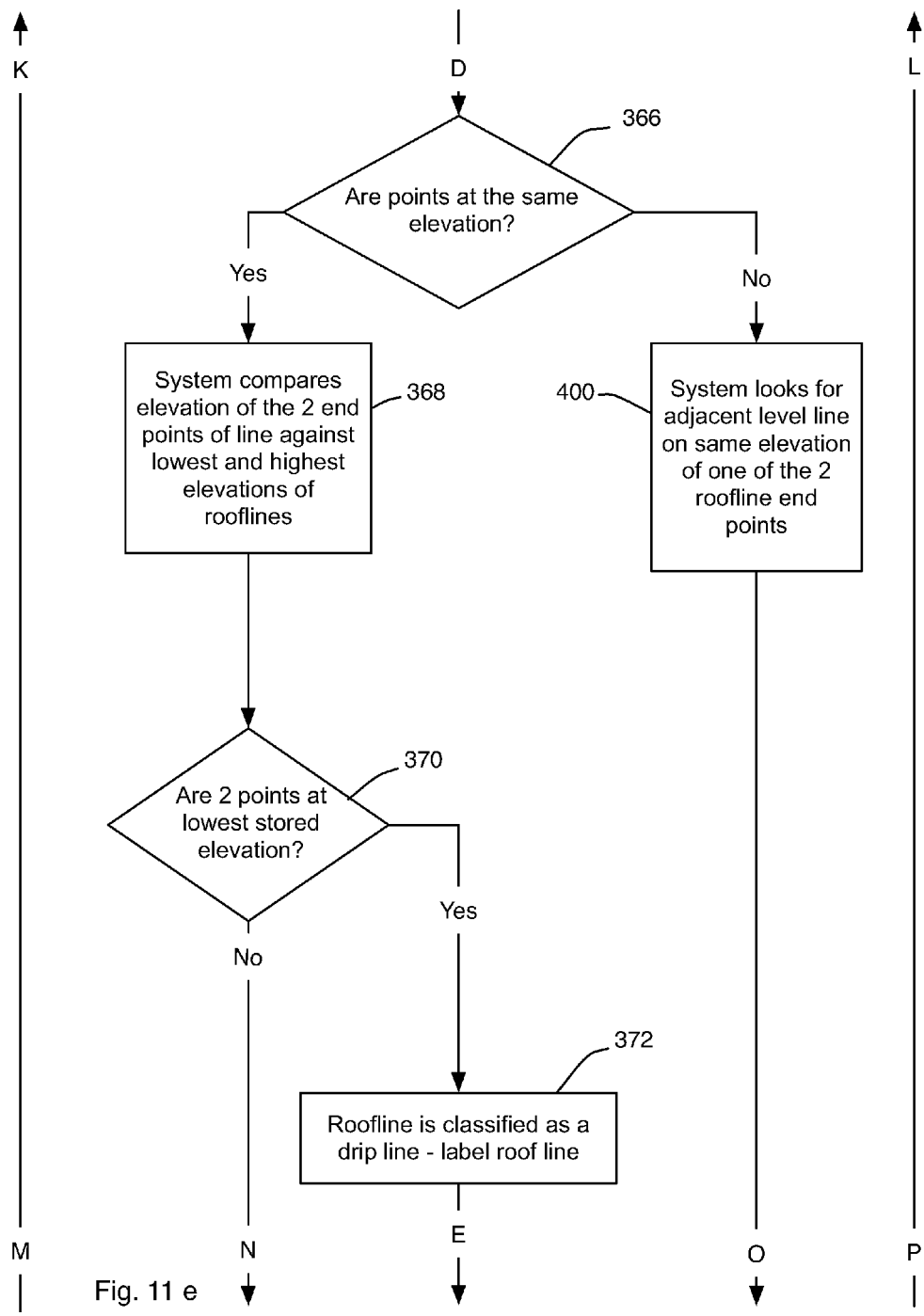
Figure 11:
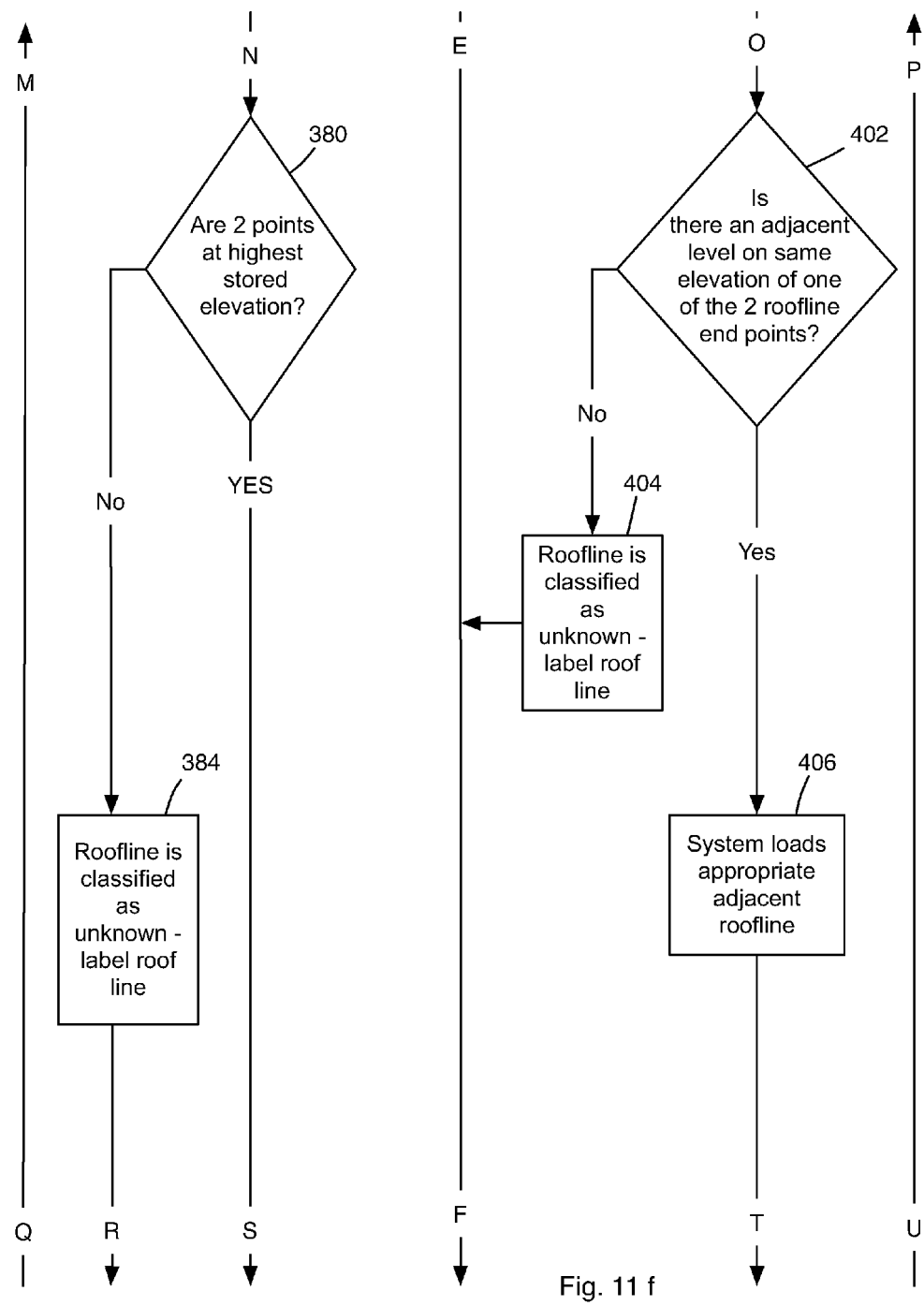
Figure 11:
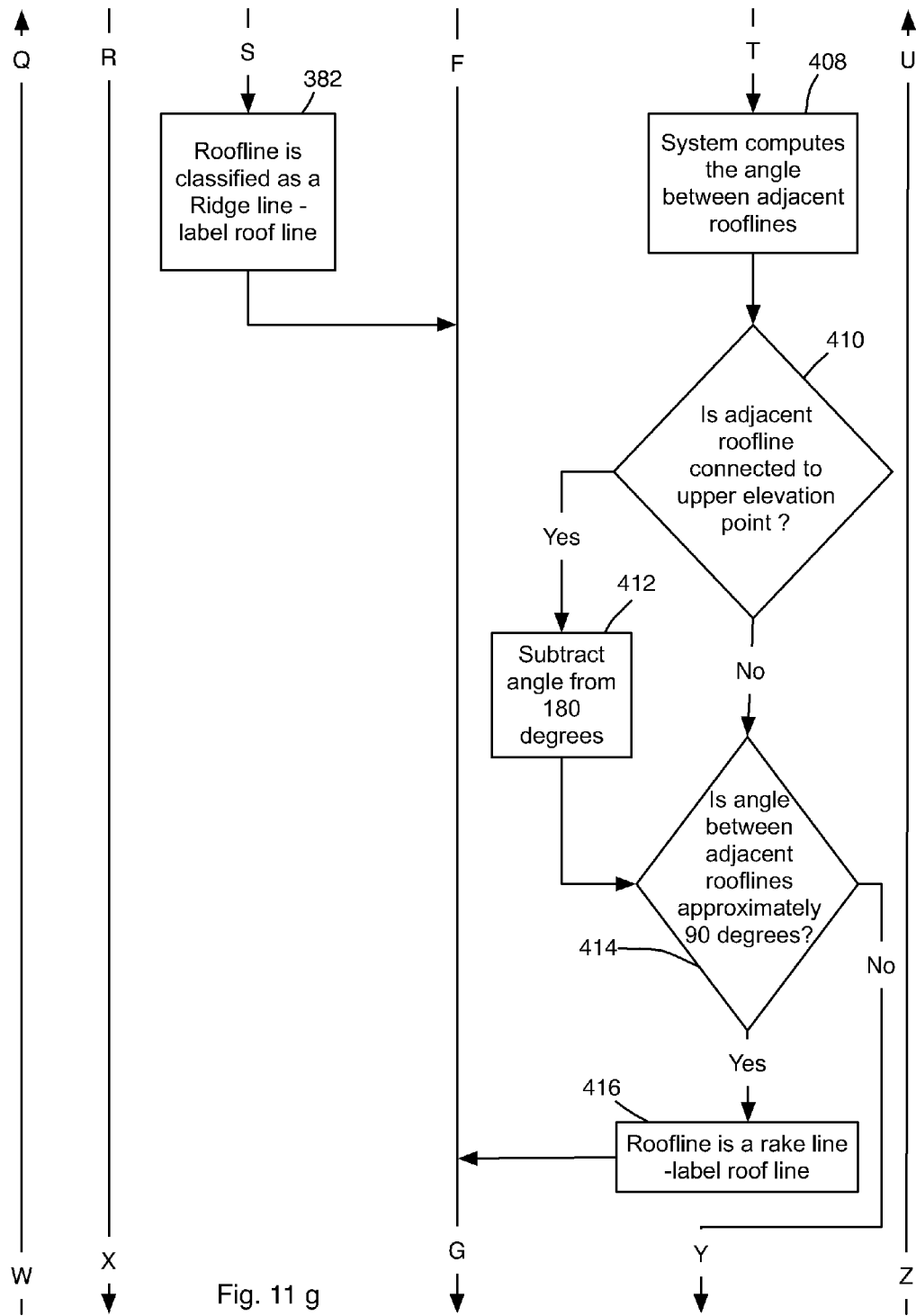
Figure 11:
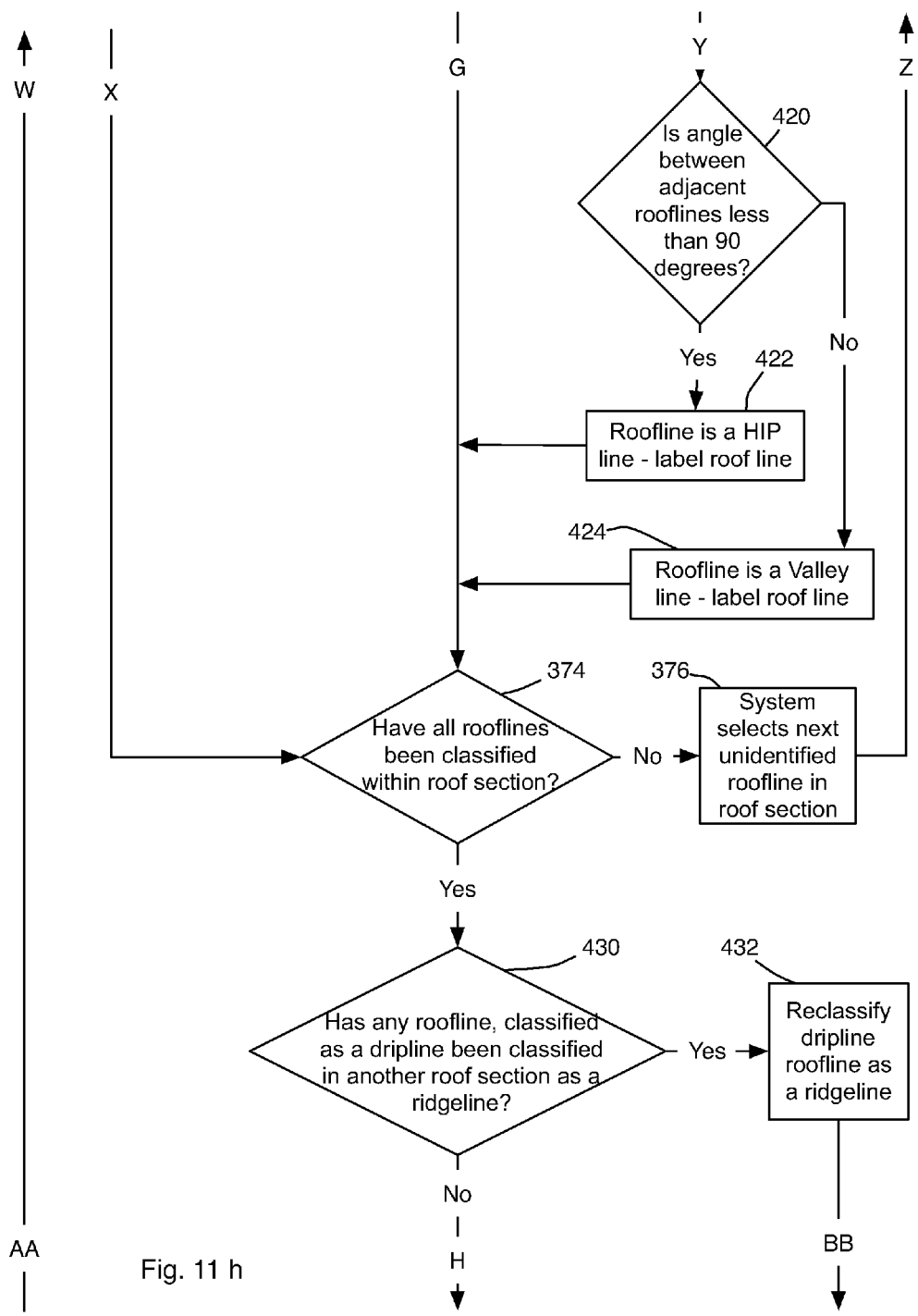
Figure 11:
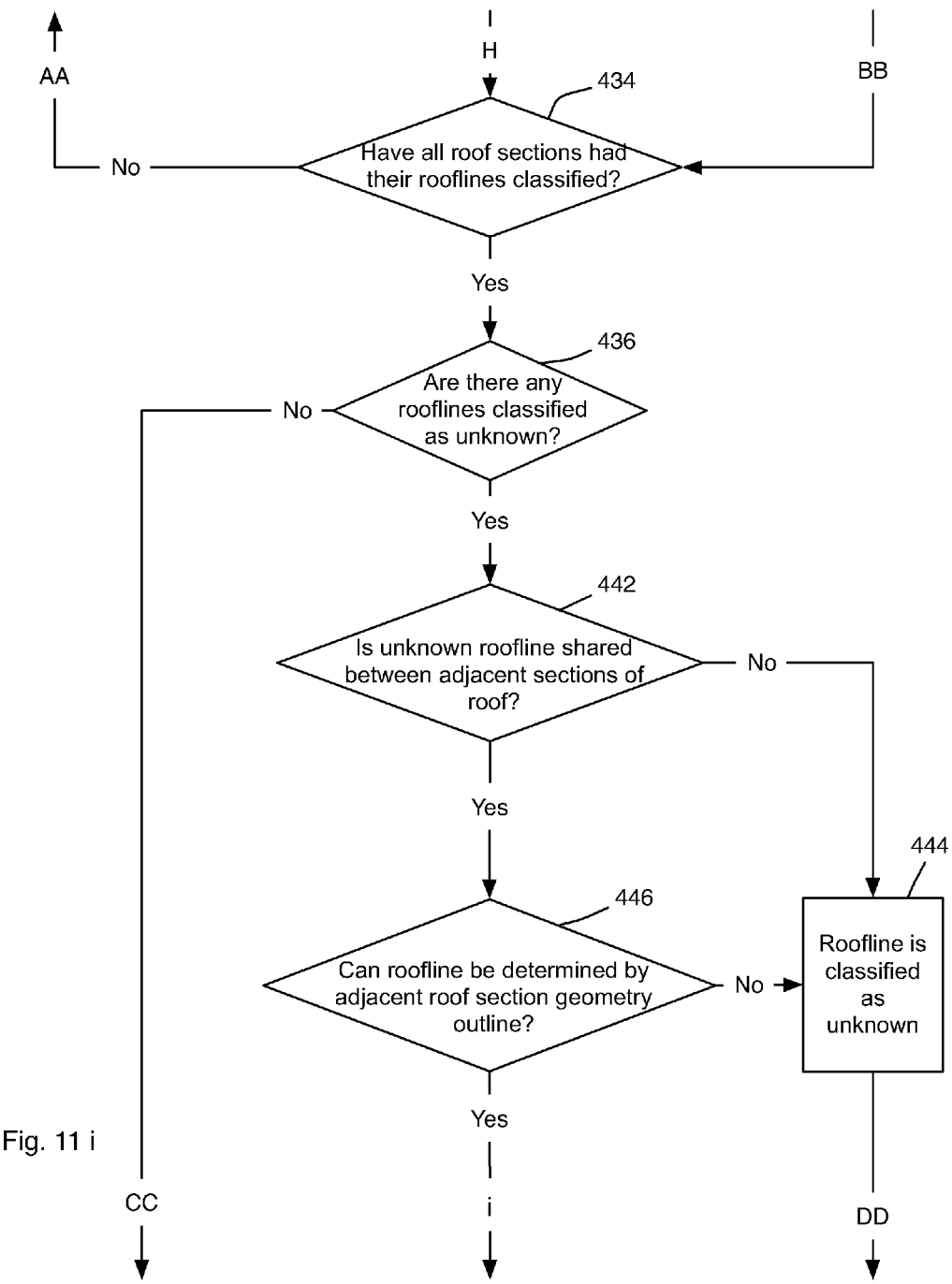
Figure 11:
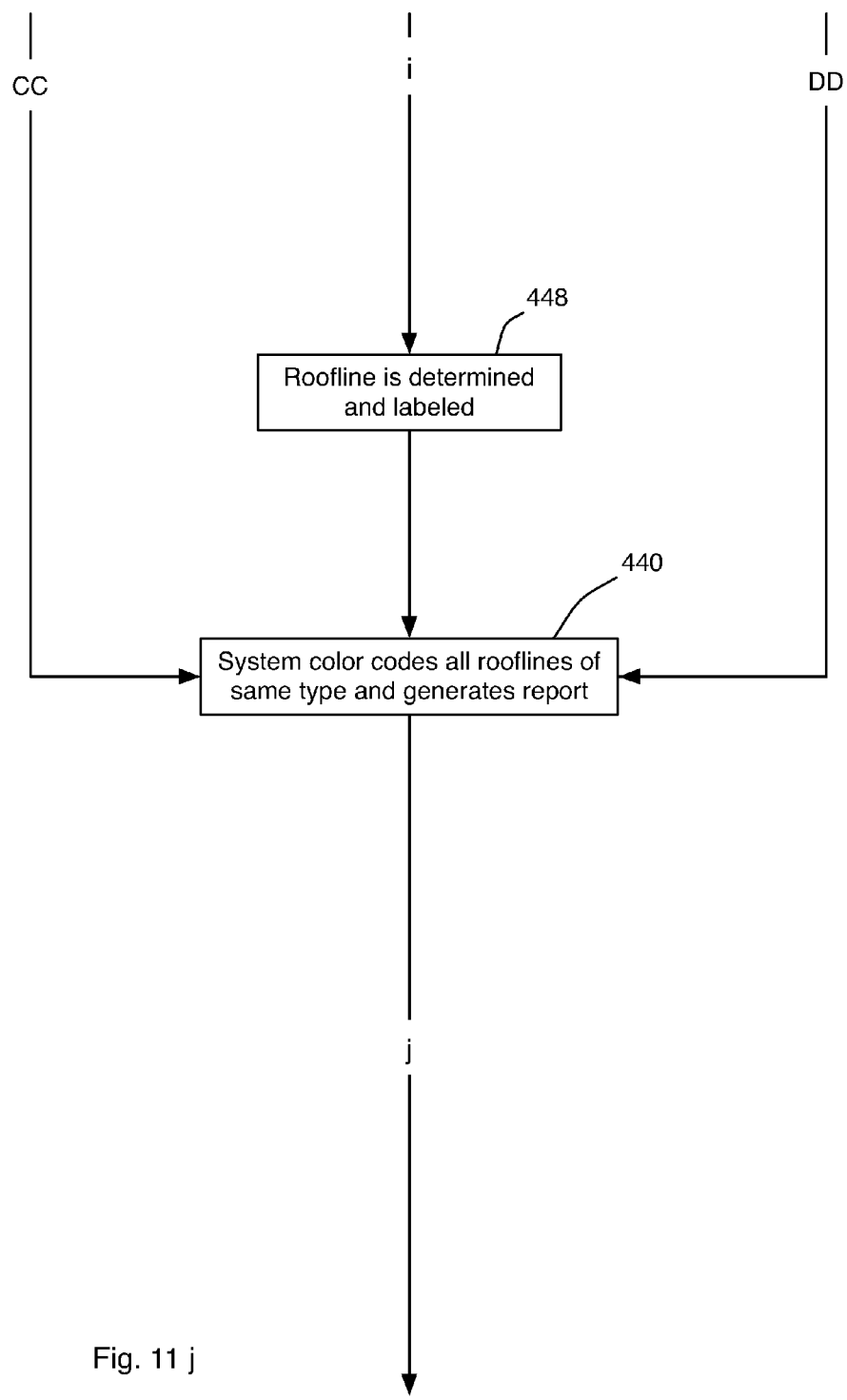
Figure 11:
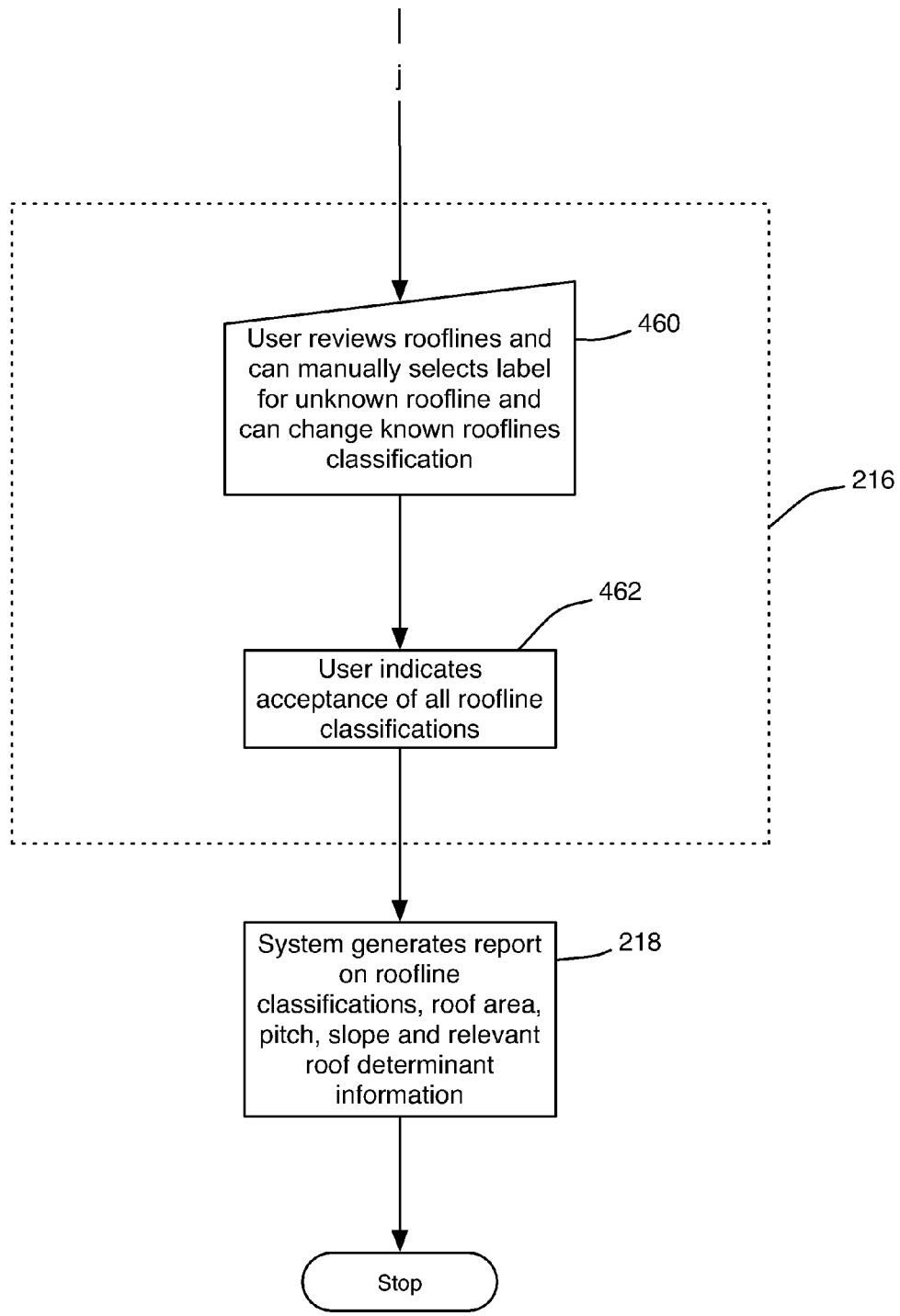

Referring to FIGS. 5 and 11A, examples of the step 204 for defining the roof sections will be described in more detail. In particular, a first step 250 in defining the roof sections is to obtain a relevant geographic location which can be identified by an address, county identifier or the like of the building 102. Once the geographic location is obtained, a set of images representing the geographic location is then obtained and then the first image 101 can be selected and displayed on the display 36, for example. The first image 101 can be obtained from the database servers 18 discussed above. The relevant geographic location can be obtained internally, through calculating a position based upon a mathematical formula, or through an external entity, such as a database or user input. In the preferred embodiment, the user device 14 receives an address of the building 102 or a region identifier (i.e., subdivision, township or the like) encompassing multiple addresses and/or multiple buildings 102 from the user via the keyboard 38, mouse 40 or other input device. When the region identifier is received, the computer system 10 may execute the instructions of the classification process 200 for each of the addresses and/or buildings within a region identified by the region identifier.

The classification process 200 branches to a step 252 where the computer system 10 receives a selection of the first image 101, and then the classification process 200 branches to a step 254 where the computer system 10 receives selection of a point 256a on a roof line to define a boundary of a roof section. The line segments 112, 114, 116, 118, 120, 122, 124, 132, 134, 136, 140, and 142 may be referred to herein as "rooflines". The classification process 200 then branches to a step 258 where the computer system 10 determines if the user has selected all points to define the roof section, and if not, the classification process 200 branches to the step 254 for the user to select another point, such as point 256b. Once the user has selected all points 256a-g to define the roof section 104, for example, the classification process 200 branches to a step 262 where the user inputs all points 256a-g selected to define the roof section 104, such as by clicking an "Add Roof Section" button 266.

The classification process 200 then branches to a step 268 to determine whether the user has defined all of the roof sections, and if not, the classification process 200 branches to the step 254 to permit the user to define another roof section, such as the roof section 106. The computer system 10 can determine that the user is done defining all roof sections, by any suitable methodology, such as receiving input from the user. For example, the user could use the mouse 40 to click on a "Next Step" button 270.

Figure 6:
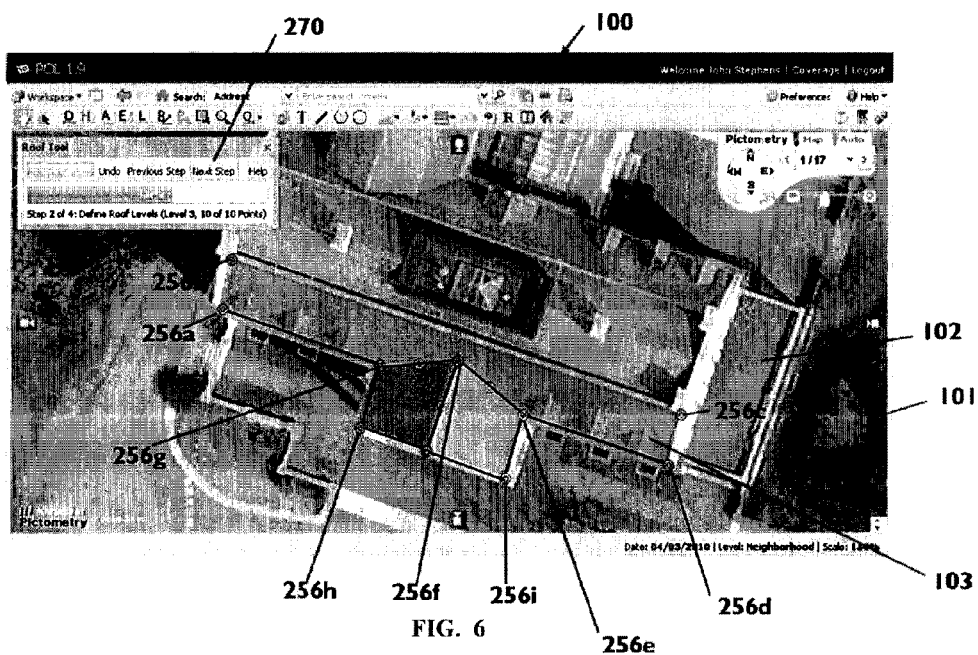
FIG. 6 is a pictorial representation of the display of the computer system showing an exemplary process for grouping line segment end points by elevation in accordance with the presently disclosed inventive concepts.

Shown in FIG. 11B is the step 206 in which the computer system 10 groups points by elevation, preferably using input by the user. In particular, the computer system 10 branches to a step 300 where the computer system 10 waits for the user to group all roofline points at the same fixed elevation. Then, the computer system 10 branches to a step 302 where the user selects points on the rooflines points that are at the same fixed elevation. In the example of FIG. 6, the user has selected points 256a, 256d, 256e, 256g, 256h and 256i that are selected as being on the same elevation, typically by manual evaluation of the screen 100. Then, the classification process 200 branches to a step 304 in which the user indicates that all roofline points of the same fixed elevation have been selected, such as by utilizing the mouse 40 to click on the "Next Step" button 270. Thereafter, the classification process 200 branches to a step 306 to inquire whether the user has grouped all roofline points at the same fixed elevation, and if not the classification process branches to the step 302 to permit the user to select and thereby group additional roofline points at the same elevation, such as the points 256b and 256c.

Once the classification process 200 has determined that the user has grouped all roofline points at the same fixed elevation in the step 306, the classification process 200 branches to a step 308 to see if the user has indicated that all fixed elevation rooflines points have been grouped together within their respective elevations, such as by the user utilizing the mouse 40 to click on the "Next Step" button 270.

Figure 7A:
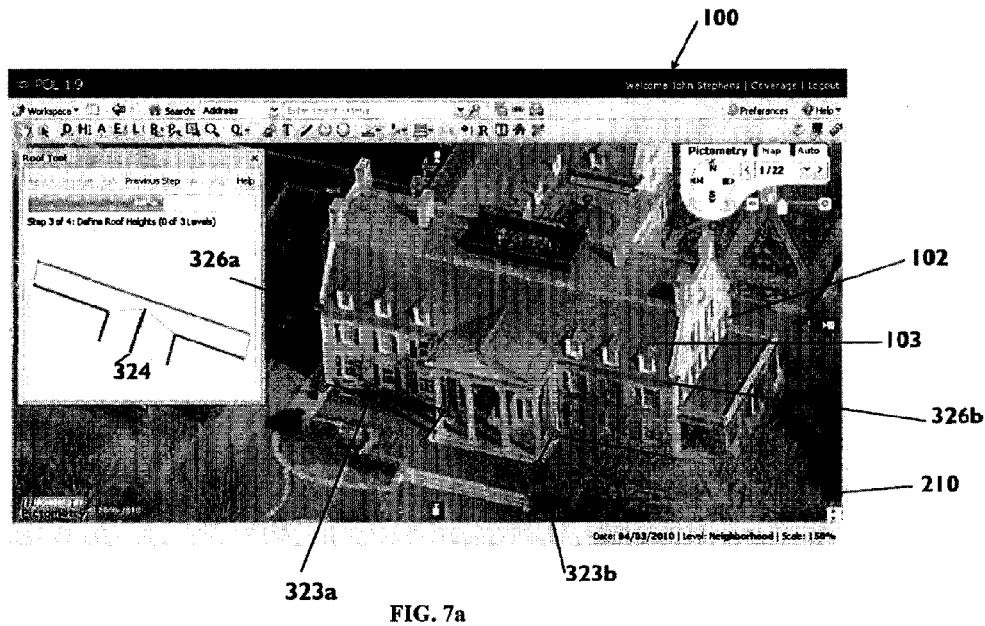
FIGS. 7A and 7B are pictorial representations of the display of the computer system having a second image utilized for calibrating line segment end points of a first set of elevation grouped rooflines in accordance with the presently disclosed inventive concepts.

The classification process 200 then branches to a step 320 where the computer system 10 displays the second image 210, which is preferably an oblique image and then branches to a step 322 where the computer system 10 pre-draws a first set of elevation grouped rooflines 323a and 323b onto the second image 210, e.g., an oblique geo-referenced image, and produces a wireframe image 324 of the roof sections 104, 106 and 108 as shown in FIG. 7a. The first set of elevation grouped rooflines 323a and 323b are formed by the set of points 256a, 256g, 256h, 256i, 256e and 256d discussed above with respect to FIG. 6. In a preferred embodiment, the elevation grouped rooflines 323a and 323b are drawn onto the second image 210 utilizing a process known in the art as manual correlation in which the estimated position of the elevation grouped rooflines 323a and 323b is calculated utilizing positional information associated with the first image 101 and the second image 210.

Figure 7B:
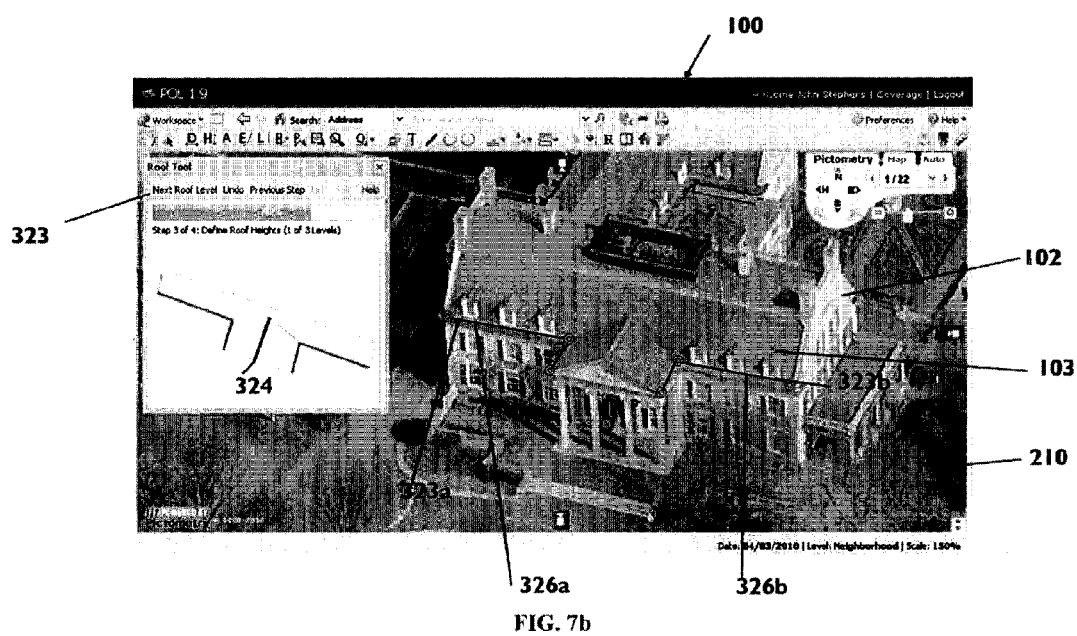
Figure 8A:
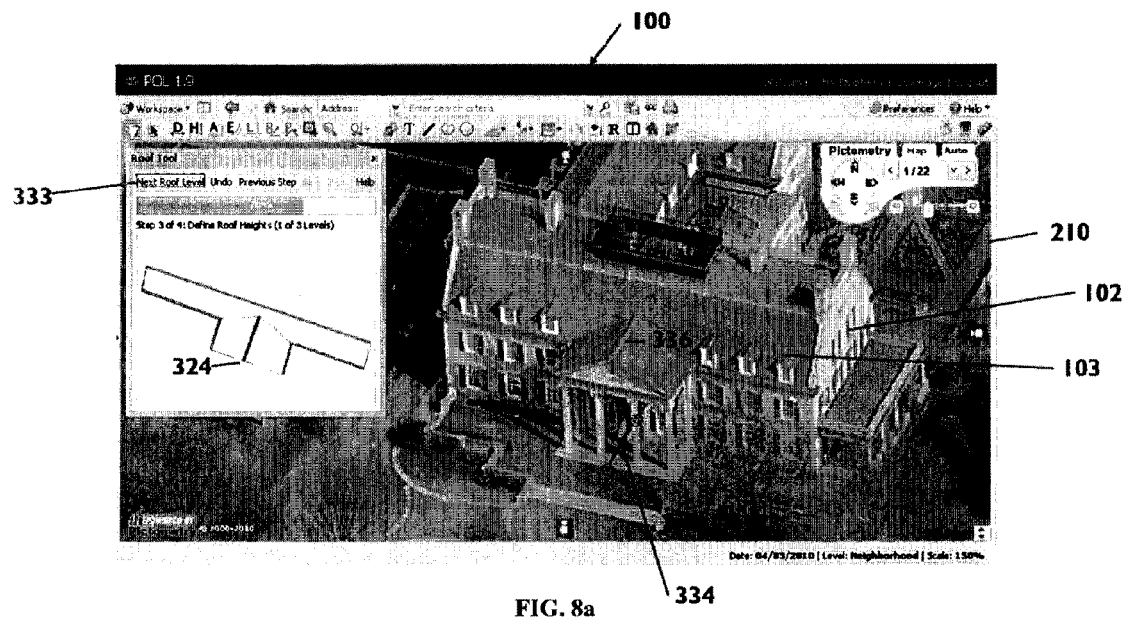
FIGS. 8A and 8B are pictorial representations of the display of the computer system having the second image utilized for calibrating line segment end points of a second set of elevation grouped rooflines in accordance with the presently disclosed inventive concepts.
Figure 8B:
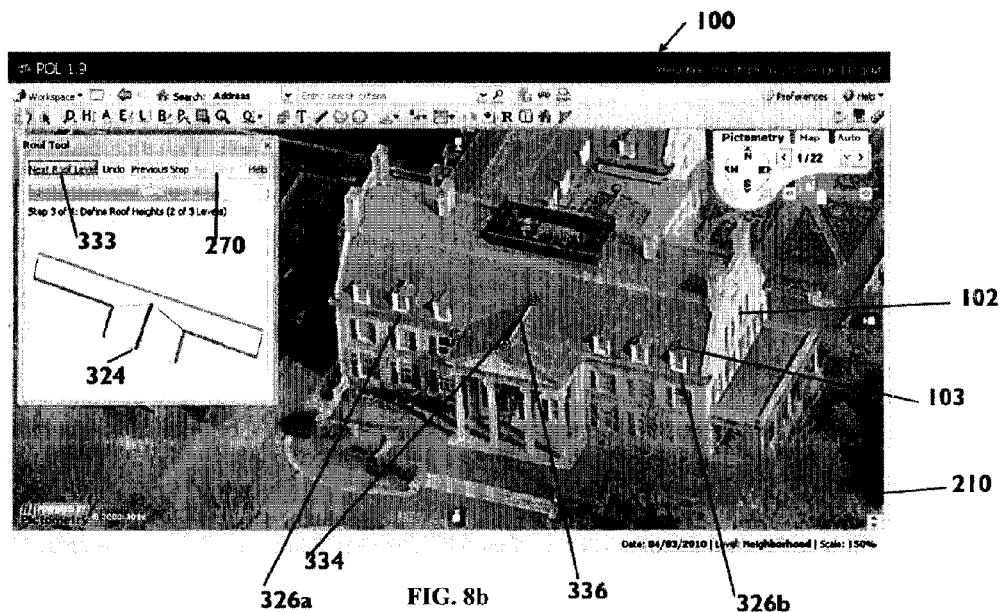
Figure 9A:
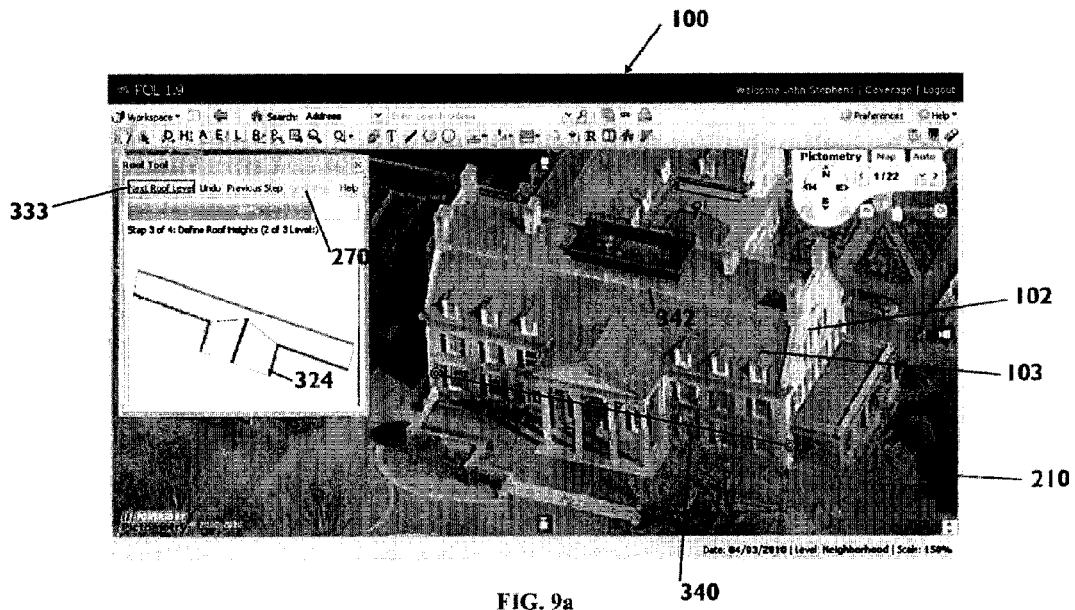
FIGS. 9A and 9B are pictorial representations of the display of the computer system having the second image utilized for calibrating line segment end points of a third set of elevation grouped rooflines in accordance with the presently disclosed inventive concepts.
Figure 9B:
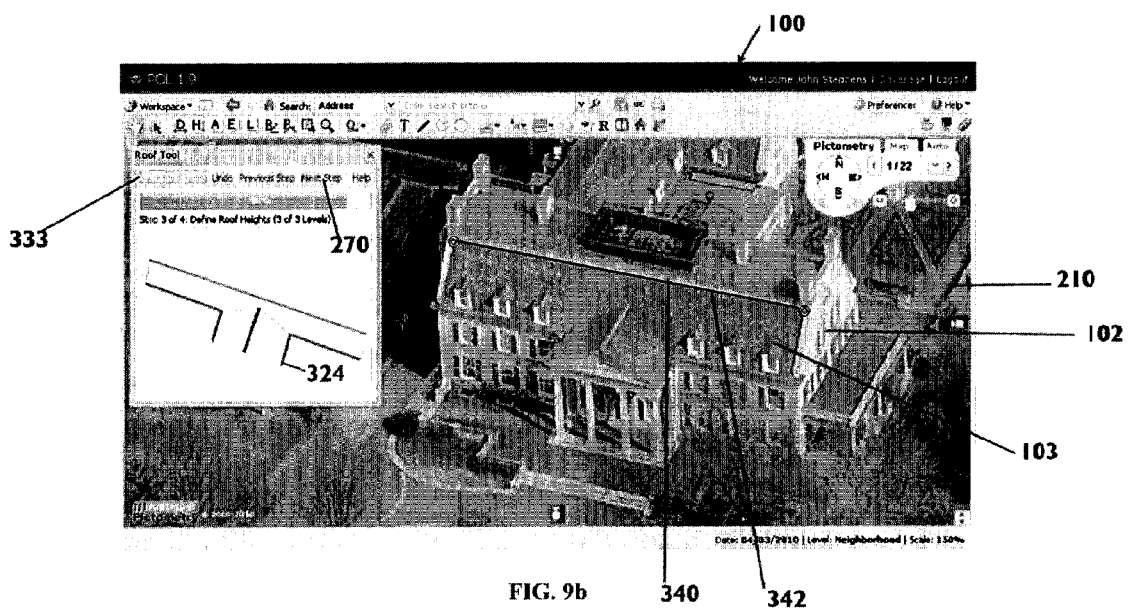

Then, the classification process 200 branches to a step 325 in which the user aligns the elevation grouped rooflines 323a and 323b onto actual rooflines 326a and 326b displayed within the second image 210. Once the user has aligned the elevation grouped rooflines 323a and 323b onto the actual rooflines 326a and 326b, as shown in FIG. 7b, the classification process 200 branches to a step 330 in which the computer system 10 calculates the average elevation of all points within the elevation grouped rooflines 323a and 323b. The classification process 200 then branches to a step 332 to determine whether the user has aligned all elevation grouped rooflines onto actual rooflines of the second image 210. If not, the user selects a "Next Roof Level" button 328, (or other suitable mechanism) and then the classification process 200 branches to the step 325 to repeat the process for each set of elevation grouped rooflines. In this example, the user has prepared 3 sets of elevation grouped rooflines; and the process repeats with the user utilizing the computer system 10 to align a second set of elevation grouped rooflines 334 with an actual roofline 336 as shown in FIGS. 8a and 8b; and with the user utilizing the computer system 10 to align a third set of elevation grouped rooflines 340 with an actual roofline 342 as shown in FIGS. 9a and 9b.

The classification process 200 then branches to the step 212 discussed above where the elevation for each of the end points of the line segments 112, 114, 116, 118, 120, 122, 124, 132, 134, 136, 140, and 142 can be calculated utilizing the first image 101 and the second image 210 preferably using stereo photogrammetry techniques. Then, an average elevation value is calculated for each set of elevation grouped rooflines 323a, 323b, 334, and 340.

The classification process branches to a first step 350 of the step 214 (discussed above with reference to FIG. 4) where the computer system 10 selects one of the roof sections 104, 106 or 108 (such as the roof section 104), and then branches to a step 352 to determine a lowest elevation point of the roof section 104, such as the elevation associated with points 256a, 256g, 256e, and 256d (as shown in FIG. 5). The classification process 200 then branches to a step 354 where the computer system 10 stores the lowest elevation point of the roof section 104, and then branches to a step 356 where the computer system 10 determines a highest elevation point of the roof section 104 and then branches to a step 358 to store the highest elevation point(s). In this example, the highest elevation point(s) of the roof section 104 is associated with points 256b and 256c (as shown in FIG. 5). Then, the computer system 10 branches to a step 362 to select two points on a line segment associated with roofline such as the line segment 112 (shown in FIG. 2) and then branches to a step 364 to determine whether the line segment, for example, is level by comparing the elevation of the two endpoints of the line segment. As indicated by a step 366, if the elevation of the two endpoints is the same, the classification process 200 branches to a step 368 where the computer system 10 compares the elevation of the two endpoints of the line segment against the lowest and highest elevations of rooflines/line segments within the roof section 104. The classification process 200 then branches to a step 370 where the computer system determines whether the two points are at the lowest stored elevation and if so the roofline/line segment is classified as an eave or drip edge line in a step 372. The classification process then branches to a step 374 where the system determines if all roofline/line segments have been classified within the roof section 104. If not, the classification process 200 branches to a step 376 (shown in FIG. 11h) where the computer system 10 selects a next unidentified roofline/line segment in the roof section 104 and then branches back to the step 360 (shown in FIG. 11d).

Referring back to step 370 (shown in FIG. 11e), if the computer system 10 determines that the two points are not at the lowest stored elevation, the computer system 10 branches to a step 380 to determine if the two points are at the highest stored elevation. If so, the classification process 200 branches to a step 382 (shown in FIG. 11g) and classifies and stores information indicative of the roofline/line segment being a ridgeline. The classification process 200 then branches to the step 374 as shown in FIG. 11h. However, if the computer system 10 determines that the two points are not at the highest stored elevation at the step 380, then the classification process 200 branches to a step 384 where the roofline/line segment is classified as unknown, and then the classification process 200 then branches to the step 374 shown in FIG. 11h.

Referring back to step 366, if the computer system 10 determines that the two points are not at the same elevation (i.e. the line segment extending between the two points is not level), then the classification process 200 branches to a step 400 where the computer system 10 analyzes adjacent level lines on a same elevation as one of the two points, and then branches to a step 402 (shown in FIG. 11f). At the step 402, the computer system 10 determines whether there is an adjacent level line segment on a same elevation as one of the two roofline endpoints. If not, the classification process 200 branches to a step 404 where the roofline/line segment is classified as unknown, and then to the step 374 as discussed above.

However, if the computer system 10 determines that there is an adjacent level line segment on the same elevation as one of the two roofline endpoints, the classification process 200 branches from the step 402 to a step 406 where the computer system 10 loads the appropriate adjacent roofline/line segment and then branches to a step 408 (shown in FIG. 11g) where the computer system 10 computes an angle between the adjacent roofline/line segments utilizing trigonometric techniques. The classification process 200 then branches to a step 410 to determine whether the adjacent roofline/line segment is connected to an upper elevation point, such as points 256b, or 256c and if so the classification process 200 branches to a step 412 to subtract the angle computed in step 408 from 180° and then branches to a step 414 to determine whether the angle between the adjacent rooflines is approximately 90°, e.g., from 85° to 95°. If so, the roofline/line segment is classified as a rake line at a step 416 and then the classification process 200 branches to the step 374 as discussed above.

However, if the adjacent roofline/line segment is not connected to an upper elevation point, then the classification process 200 branches from the step 410 to the step 414 and bypasses the step 412. If at the step 414, the computer system 10 determines that the angle between adjacent rooflines is not approximately 90°, the classification process branches to a step 420 (shown in FIG. 11h) to determine whether the angle between the adjacent roofline/line segment is less than 90°. If so, the roof line/line segment is classified as a hip line at a step 422, and if not, the roofline/line segment is classified as a valley line at a step 424.

Once all of the rooflines have been classified within the roof section 104 as determined by the step 374, the classification process 200 then branches to a step 430 to determine whether any roofline/line segment classified as an eave or drip edge line has also been classified in another roof section as a ridgeline. If so, then the classification process 200 re-classifies the roofline/line segment as a ridgeline at a step 432, and if not, the classification process 200 branches to a step 434 to determine whether all roof sections have been analyzed. If not, the classification process branches back to the step 350 (shown in FIG. 11d) to repeat the process for another one of the roof sections 104, 106 and 108. Once all of the roof sections 104, 106 and 108 have had all of their roofline/line segments classified, then the classification process 200 branches to a step 436 to determine whether any have the roofline/line segments have been classified as unknown. If not, then all of the roofline/line segments have been classified as one of the predefined roof elements, and then the classification process 200 branches to a step 440 where the computer system 10 preferably color codes all rooflines/line segments.

However, if at the step 436, any of the roofline/line segments are classified as unknown, the classification process 200 tries to reclassify the unknown line segments utilizing roofline/line segments within an adjacent roof section. In particular, the classification process 200 branches to a step 442 to determine whether any roofline/line segments classified as unknown are shared between adjacent roof sections 104, 106 and 108 of the roof. If not, the roofline/line segments are classified as unknown at a step 444, and if so the classification process 200 branches to a step 446 to determine whether roofline/line segment can be classified based upon the geometry of the adjacent roof section utilizing the techniques discussed above. If so, the classification process 200 branches to a step 448 where a classification for the roofline/line segment is determined and labeled. However, if at the step 446 the classification for the roofline/line segment cannot be determined by the adjacent roofline/line segment geometry, the classification process 200 branches to the step 444 where the roofline/line segment is classified as unknown.

The classification process 200, then branches to the step 216 to permit user review of the classifications and make any changes if necessary or desirable, and then the classification process 200 branches to a step 218 to generate the report 160. The step 216 is shown in more detail in FIG. 11k. In particular, the classification process 200 branches to a step 460 where the user reviews rooflines/line segments, and can manually select and change known and unknown classifications. Once the user selects and/or changes known and unknown classifications, the classification process 200 branches to a step 462 in which the user indicates acceptance of all roofline/line segment classifications.

In various aspects, the set of instructions discussed above can be distributed or used in a variety of manners. For example, one or more computer readable medium storing the set of instructions could be sold and/or distributed through retail locations as a set of one or more CD-ROMs or downloaded from an server. The term "sold" as used herein includes a sale where ownership is transferred, as well as an exchange of funds where a license or rights are granted but ownership has not changed. As another example, the set of instructions could be made available to the processor for execution in a variety of manners, such as by installing the set of instructions onto a local hard drive or memory, or by having the processor access a remote server or memory providing the set of instructions.

Although the foregoing has been described in some detail by way of illustration and example for purposes of clarity of understanding, it will be obvious to those skilled in the art that certain changes and modifications may be practiced without departing from the spirit and scope thereof, as described in this specification and as defined in the appended claims below.

What is claimed is:

1. An apparatus comprising:
   at least one non-transitory computer readable medium storing a set of instructions for running on a computer system, the set of instructions comprising:
   instructions for identifying line segments of a roof shown in at least two images using input from a user selecting end points of the line segments in a first image of the at least two images;
   instructions for determining three-dimensional information of the line segments including position, orientation and length of the line segments; and
   instructions for determining, automatically, a classification of at least one of the line segments utilizing position and orientation of a first line segment relative to a position and orientation of a second line segment of the line segments as one of a plurality of predefined roof elements.

2. The apparatus of claim 1, wherein the set of instructions further comprises instructions for generating a three-dimensional model of the roof utilizing the line segments.

3. The apparatus of claim 1, wherein the set of instructions further comprises at least one instruction for storing classification information indicative of a classification of the at least one line segment as the plurality of predefined roof elements.

4. The apparatus of claim 3, wherein the line segments have lengths, and wherein the set of instructions further comprises instructions for generating a report including a cumulative length of the line segments for one or more predefined roof element.

5. The apparatus of claim 1, wherein the set of instructions further comprises instructions for grouping the end points of the line segments by elevation into at least a first group, and wherein the instructions for determining three-dimensional information of the line segments including position, orientation and length of the line segments is defined further as determining the three-dimensional information of the line segments utilizing at least the first group.

6. The apparatus of claim 5, wherein the instructions for grouping the end points of the line segments by elevation include instructions for receiving user input to group the end points of the line segments by elevation.

7. The apparatus of claim 5, wherein the set of instructions further comprises instructions for calculating an elevation of each end point of the line segments and then averaging the elevation within each group of end points.

8. The apparatus of claim 1, wherein the set of instructions includes instructions for determining whether at least two points on the line segments are at a same elevation in classifying the line segments as predefined roof elements.

9. The apparatus of claim 1, wherein the predefined roof elements are selected from a group consisting of a rake and a valley, and wherein the set of instructions includes instructions for determining an angle between adjacent line segments in classifying one of the line segments as at least one of a rake and a valley.

10. The apparatus of claim 1, wherein the predefined roof elements are selected from a group consisting of a ridge and an eave, and wherein the set of instructions includes instructions for determining a relative elevation between line segments within a roof section in classifying one of the line segments as at least one of a ridge and an eave.

11. A method, comprising the step of:
making a set of instructions on a non-transitory computer readable storage medium accessible to a processor of a computer system, the set of instructions including instructions for identifying line segments of a roof shown in at least two images using input from a user selecting points of line segments in a first image, the line segments having end points; grouping by elevation at least two of the end points of the line segments displayed in at least one image; determining three-dimensional information of the line segments including position, orientation and length of the line segments using the grouped end points; and determining, automatically, a classification of at least one of the line segments utilizing at least one of the relative position and orientation of the line segments as one of a plurality of predefined roof elements.

12. A method, comprising the step of:
selling and distributing a set of instructions stored on at least one non-transitory computer readable storage medium, the set of instructions comprising instructions for identifying line segments of a roof shown in at least two images using input from a user selecting points of line segments in a first image, the line segments having end points; grouping by elevation at least two of the end points of the line segments displayed in at least one image; determining three-dimensional information of the line segments including position, orientation and length of the line segments using the grouped end points; and determining, automatically, a classification of at least one of the line segments utilizing at least one of the relative position and orientation of the line segments as one of a plurality of predefined roof elements.

13. A method comprising the step of:
providing access to a set of instructions stored on a first non-transitory computer readable storage medium for installation on a second non-transitory computer readable storage medium associated with a user device, the set of instructions including instructions for identifying line segments of a roof shown in at least two images using input from a user selecting points of line segments in a first image, the line segments having end points; grouping by elevation at least two of the end points of the line segments displayed in at least one image; determining three-dimensional information of the line segments including position, orientation and length of the line segments using the grouped end points; and determining, automatically, a classification of at least one of the line segments utilizing at least one of the relative position and orientation of the line segments as one of a plurality of predefined roof elements.

14. A computer system, comprising:
at least one processor;
one or more non-transitory computer readable storage medium storing a set of instructions that when executed by the at least one processor cause the at least one processor to:
identify line segments of a roof displayed within one or more geo-referenced images shown in at least two images using input from a user selecting points of line segments in a first image, the line segments having end points;
group by elevation at least two of the end points of the line segments displayed in at least one image;
determine three-dimensional information of the line segments including position, orientation and length of the line segments utilizing the one or more geo-referenced images using the grouped end points; and
determine, automatically, a classification of at least one of the line segments utilizing at least one of the relative position and orientation of the line segments as one of a plurality of predefined roof elements.

15. A set of instructions stored on at least one non-transitory computer readable storage medium for running on a computer system, the set of instructions comprising:
instructions that when executed by at least one processor of the computer system cause the at least one processor to identify and group together end points of rooflines of a roof depicted in a first image to create one or more sets of elevation grouped rooflines, the first image being an orthogonal image; and
instructions that when executed by the at least one processor of the computer system cause the at least one processor to receive signals from a user to align the one or more sets of elevation grouped rooflines of the roof onto actual rooflines displayed within a second image, the second image being an oblique image.

16. The set of instructions stored on the at least one non-transitory computer readable storage medium for running on the computer system of claim 15, the set of instructions further comprising:
instructions that when executed by at least one processor of the computer system cause the at least one processor to calculate elevations of the end points using the identified end points in the first image and the aligned sets of elevation grouped rooflines in the second image.

17. A computer system, comprising:
at least one processor;
one or more non-transitory computer readable storage medium storing a set of instructions that when executed by the at least one processor cause the at least one processor to:
identify line segments of a roof displayed within one or more geo-referenced images shown in at least two images using input from a user selecting points of line segments in a first image, the line segments having end points;
group by elevation at least two of the end points of the line segments displayed in at least one image;
determine information of the line segments including position, orientation and length of the line segments utilizing the one or more geo-referenced images using the grouped end points; and
determine, automatically, a classification of at least one of the line segments utilizing at least one of the relative position and orientation of the line segments as one of a plurality of predefined roof elements.

18. A computer system, comprising:
at least one processor;
one or more non-transitory computer readable storage medium storing a set of instructions that when executed by the at least one processor cause the at least one processor to:
identify and group together end points of rooflines of a roof depicted in a first image to create one or more sets of elevation grouped rooflines, the first image being an orthogonal image; and
receive signals from a user to align the one or more sets of elevation grouped rooflines of the roof onto actual rooflines displayed within a second image, the second image being an oblique image.

19. A computer system, comprising:

at least one processor;

one or more non-transitory computer readable storage medium storing a set of instructions that when executed by the at least one processor cause the at least one processor to:

draw at least part of a wireframe image of a roof, using locations of end points of line segments identified by a user in a first image depicting the roof and using rooflines grouped by elevation based at least in part on the locations of the end points; and align the wireframe image of the roof drawn in the first image with a same roof depicted in a second image, the first and second images being captured from different perspectives; wherein the first image is an orthogonal image and the second image is an oblique image.

* * * * *